US012642086B2

(12) United States Patent
Hsieh et al.

(10) Patent No.: US 12,642,086 B2
(45) Date of Patent: May 26, 2026

(54) MULTI-TIM PACKAGES AND METHOD FORMING SAME

(71) Applicant: Taiwan Semiconductor Manufacturing Co., Ltd., Hsinchu (TW)

(72) Inventors: Ping-Yin Hsieh, Hsinchu (TW); Pu Wang, Hsinchu (TW); Li-Hui Cheng, New Taipei City (TW); Szu-Wei Lu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/446,014

(22) Filed: Aug. 8, 2023

(65) Prior Publication Data

US 2023/0378020 A1      Nov. 23, 2023

Related U.S. Application Data

(62) Division of application No. 17/381,952, filed on Jul. 21, 2021.

(Continued)

(51) Int. Cl.
*H01L 23/367*       (2006.01)
*H01L 21/48*       (2006.01)
(Continued)

(52) U.S. Cl.
CPC ...... *H01L 23/3675* (2013.01); *H01L 21/4882* (2013.01); *H01L 23/373* (2013.01); *H01L 23/49816* (2013.01); *H01L 23/49822*

(2013.01); *H01L 23/49833* (2013.01); *H01L 23/49838* (2013.01); *H01L 24/16* (2013.01); *H01L 24/32* (2013.01); *H01L 24/73* (2013.01); *H01L 25/105* (2013.01); *H01L 25/50* (2013.01); *H01L 2224/16237* (2013.01);
(Continued)

(58) Field of Classification Search
None
See application file for complete search history.

(56) References Cited

U.S. PATENT DOCUMENTS 7,593,228 B2 *    9/2009    Jarrett ................... H01L 23/433
257/713
8,993,380 B2      3/2015    Hou et al.
(Continued)

FOREIGN PATENT DOCUMENTS

CN          110718513  A       7/2018
CN          208690235  U   *   4/2019    ......... H01L 21/4817
(Continued)

*Primary Examiner* — Telly D Green
(74) *Attorney, Agent, or Firm* — Slater Matsil, LLP

(57) ABSTRACT

A method includes placing a package, which includes a first package component, a second package component, and an encapsulant encapsulating the first package component and the second package component therein. The method further includes attaching a first thermal interface material over the first package component, attaching a second thermal interface material different from the first thermal interface material over the second package component, and attaching a heat sink over both of the first thermal interface material and the second thermal interface material.

20 Claims, 19 Drawing Sheets

Related U.S. Application Data

(60) Provisional application No. 63/184,587, filed on May 5, 2021.

(51) Int. Cl.

| | |
|---|---|
| *H01L 23/00* | (2006.01) |
| *H01L 23/373* | (2006.01) |
| *H01L 23/498* | (2006.01) |
| *H01L 25/00* | (2006.01) |
| *H01L 25/10* | (2006.01) |

(52) U.S. Cl.

CPC .............. *H01L 2224/32225* (2013.01); *H01L 2224/73204* (2013.01); *H01L 2924/1431* (2013.01); *H01L 2924/1434* (2013.01); *H01L 2924/182* (2013.01); *H01L 2924/3511* (2013.01); *H01L 2924/35121* (2013.01)

(56) References Cited

U.S. PATENT DOCUMENTS

| | | | |
|---|---|---|---|
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,468,136 | B2 * | 10/2016 | Ross ........................ H01L 24/29 |
| 9,496,189 | B2 | 11/2016 | Yu et al. |
| 9,666,502 | B2 | 5/2017 | Chen et al. |
| 9,735,131 | B2 | 8/2017 | Su et al. |
| 10,062,665 | B2 | 8/2018 | Chen et al. |
| 10,269,592 | B1 | 4/2019 | Doany et al. |
| 10,515,869 | B1 | 12/2019 | Yeh et al. |
| 10,707,196 | B2 | 7/2020 | Kim et al. |
| 11,011,447 | B2 | 5/2021 | Wang et al. |
| 11,114,364 | B2 | 9/2021 | Kim et al. |
| 11,257,690 | B2 | 2/2022 | Hung |
| 2005/0068739 | A1 * | 3/2005 | Arvelo ................ H01L 23/3675 257/E23.09 |
| 2006/0227510 | A1 * | 10/2006 | Fitzgerald ............... H01L 24/32 257/E21.503 |
| 2007/0212812 | A1 | 9/2007 | Chow |
| 2008/0237841 | A1 | 10/2008 | Arana |
| 2009/0244850 | A1 | 10/2009 | Suh |
| 2010/0181665 | A1 | 7/2010 | Casey et al. |
| 2011/0038124 | A1 | 2/2011 | Burnham |
| 2014/0193658 | A1 * | 7/2014 | Ross ........................ H01L 21/50 228/179.1 |
| 2014/0247556 | A1 | 9/2014 | Eid et al. |
| 2015/0162307 | A1 | 6/2015 | Chen et al. |
| 2017/0162542 | A1 | 6/2017 | Chen et al. |
| 2017/0213809 | A1 | 7/2017 | Lu et al. |
| 2018/0090411 | A1 | 3/2018 | Cetegen et al. |
| 2019/0132994 | A1 | 5/2019 | Johnson |
| 2019/0198489 | A1 | 6/2019 | Kim et al. |
| 2019/0371700 | A1 | 12/2019 | Yeh et al. |
| 2019/0385929 | A1 | 12/2019 | Ku et al. |
| 2020/0058571 | A1 | 2/2020 | Wang et al. |
| 2020/0066612 | A1 | 2/2020 | Hung et al. |
| 2020/0144155 | A1 | 5/2020 | Yeh et al. |
| 2020/0161275 | A1 | 5/2020 | Lin et al. |
| 2020/0251403 | A1 | 8/2020 | Kothari et al. |
| 2020/0294817 | A1 | 9/2020 | Hung |
| 2020/0335480 | A1 | 10/2020 | Hwang et al. |
| 2020/0373220 | A1 | 11/2020 | Chan Arguedas et al. |
| 2021/0118770 | A1 | 4/2021 | Kuo et al. |
| 2021/0272869 | A1 | 9/2021 | Wang et al. |
| 2021/0305227 | A1 * | 9/2021 | Chen ........................ H01L 23/04 |
| 2021/0384096 | A1 | 12/2021 | Lee et al. |

FOREIGN PATENT DOCUMENTS

| | | |
|---|---|---|
| KR | 20190076661 A | 7/2019 |
| KR | 20190129665 A | 11/2019 |
| KR | 20200006734 A | 1/2020 |
| TW | 202105639 A | 2/2021 |

* cited by examiner

200

Placing package components — 202

Reflow and dispensing underfill — 202

Attaching first TIMs — 202

Attaching second TIMs — 202

Dispensing filling material between TIMs — 202

Dispensing adhesive ring — 202

Dispensing heat sink — 202

Curing adhesive and filling material — 202

MULTI-TIM PACKAGES AND METHOD FORMING SAME

PRIORITY CLAIM AND CROSS-REFERENCE

This application is a divisional of U.S. patent application Ser. No. 17/381,952, filed on Jul. 21, 2021, and entitled "Multi-TIM Packages and Method Forming Same," which claims the benefit of the U.S. Provisional Application No. 63/184,587, filed on May 5, 2021, and entitled "Novel Multi-TIM1 Structure," which applications are hereby incorporated herein by reference.

BACKGROUND

Integrated circuit packages may have a plurality of package components such as device dies and package substrates bonded together to increase the functionality and integration level. Due to the differences between different materials of the plurality of package components, warpage may occur. With the increase in the size of the packages, warpage become more severe. This incurs some new problems. For example, thermal interface material may be used to conduct heat from the device dies in the integrated circuit packages to heat sinks. Due to the warpage, delamination may occur between the thermal interface material and the corresponding device dies or packages. The delamination is usually found at the regions where material/components join to each other, such as the corners of device dies or packages, and on the weakly adhered surfaces such as the surfaces of molding compound.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
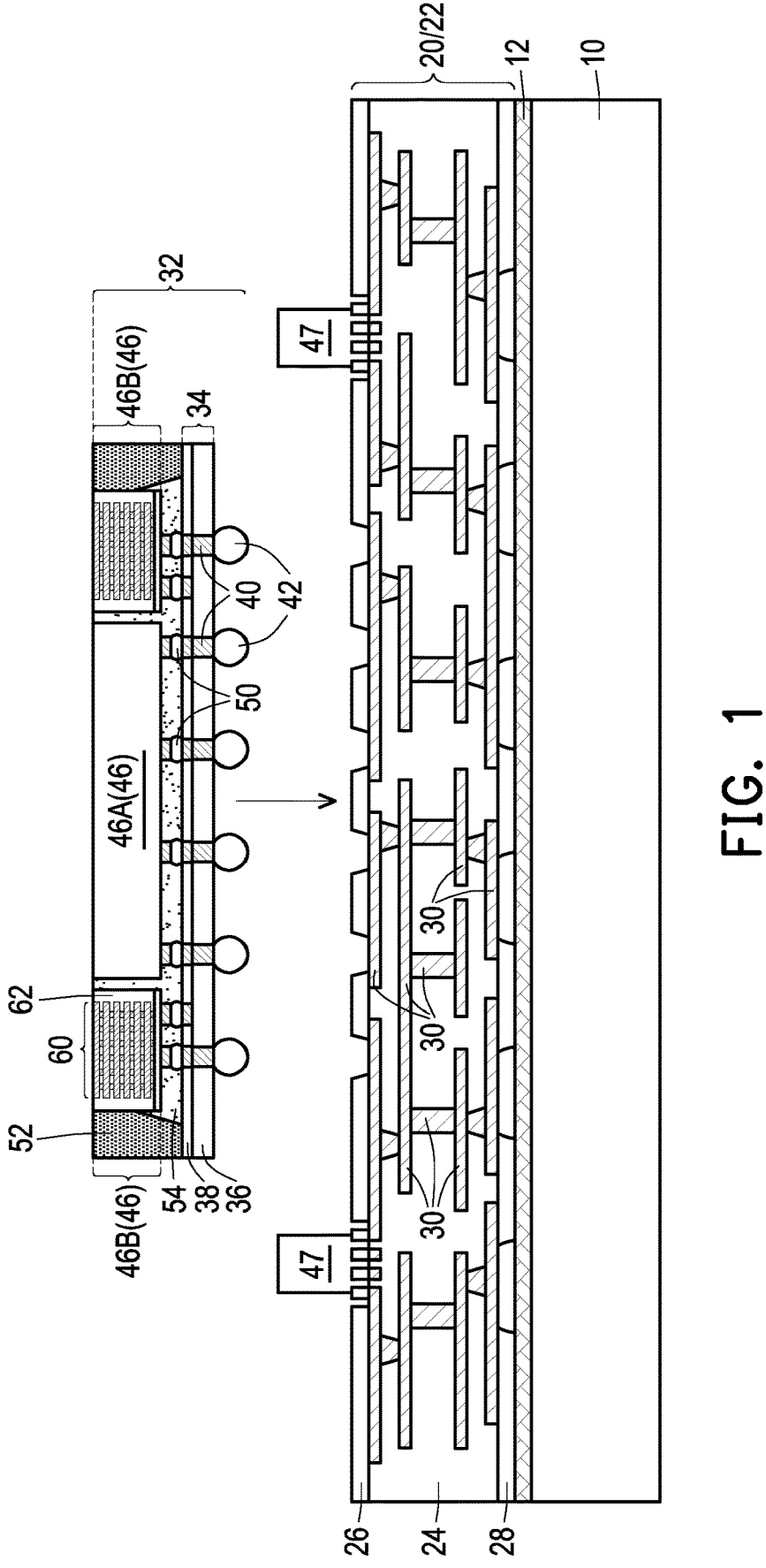
FIGS. 1-3, 4A, 4B, 4C, 5-8, 9A, and 9B illustrate the cross-sectional views of intermediate stages in the formation of a package including separate thermal interface materials in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided. In accordance with some embodiments of the present disclosure, a plurality of first package component (which may include a plurality of device dies) is bonded to a second package component. A plurality of Thermal Interface Materials (TIMs), which may be discrete TIMs or parts of a large TIM having grooves therein, are disposed on the plurality of first package components. The materials of some of the plurality of TIMs may be different from the materials of other ones of the plurality of TIMs. Alternatively, the materials of the plurality of TIMs are the same as each other. With the using of a plurality of TIMs rather than a single large TIM, the stress in the TIM is released, and delamination may be reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-3, 4A, 4B, 4C, 5-8, 9A, and 9B illustrate the cross-sectional views of intermediate stages in the formation of a package including separated TIMs over and contacting a same package component. The corresponding processes are also reflected schematically in the process flow shown in FIG. 15.

FIG. 1 illustrates a cross-sectional view of a package component 20, which includes a plurality of identical package components 22 therein. In accordance with some embodiments, package component 20 is a package substrate strip, which includes a plurality of package substrates 22 therein. Package substrates 22 may be cored package substrates including cores, or may be core-less package substrates that do not have cores therein. In accordance with alternative embodiments, package component 20 may be of another type such as an interposer wafer, a printed circuit board, a reconstructed wafer, or the like. Package component 20 may be free from (or may include) active devices such as transistors and diodes therein. Package component 20 may also be free from (or may include) passive devices such as capacitors, inductors, resistors, or the like therein.

In accordance with some embodiments of the present disclosure, package component 20 includes a plurality of dielectric layers, which may include dielectric layers 24, dielectric layer 26 over dielectric layers 24, and dielectric layer 28 under dielectric layers 24. In accordance with some embodiments, dielectric layers 26 and 28 may be formed of dry films such as Ajinomoto Build-up Films (ABFs). Alternatively, dielectric layers 26 and 28 may be formed of or comprise polybenzoxazole (PBO), polyimide, benzocyclobutene (BCB), or the like, which may be coated in a flowable form and then cured. Dielectric layers 24, when being in a core, may be formed of epoxy, resin, glass fiber, prepreg (which comprises epoxy, resin, and/or glass fiber), glass, molding compound, plastic, combinations thereof, and/or multi-layers thereof. In accordance with alternative embodiments, dielectric layers 24 may be formed of polymers such as PBO, polyimide, BCB, or the like. Redistribution lines 30, which include metal lines/pads and vias, are formed in dielectric layers 24. Redistribution lines 30 are interconnected to form through-connections in package component 20.

In accordance with some embodiments, when package component 20 is not rigid enough to support itself and the overlying structure, carrier 10 is provided to support package component 20. In accordance with alternative embodiments, package component 20 is thick and rigid (for example, when being a reconstructed wafer), and is able to support the structure formed thereon. Accordingly, carrier 10 and release film 12 may not be used. Carrier 10, when used, may be a glass carrier, an organic carrier, or the like. Release film 12 is formed on carrier 10 for attaching package components to carrier 10. Release film 12 may be formed of a polymer-based material (such as a Light-To-Heat-Conversion (LTHC) material), which may be an epoxy-based thermal-release material.

In accordance with alternative embodiments, as shown in FIG. 1, package component 20 is pre-formed, and is placed over release film 12. In accordance with alternative embodiments, package component 20 is built layer-by-layer over release film 12. For example, a blanket dielectric layer 28 may be formed on release film 12, followed by the formation of dielectric layers 24 and 26 and redistribution lines (RDLs) 30 layer-by-layer. The corresponding dielectric layers 24, 26, and/or 28 may be formed of organic materials (for example, polymers) such as polyimide, PBO, BCB, or the like. In accordance with alternative embodiments of the present disclosure, dielectric layers 24, 26, and/or 28 may be formed of inorganic dielectric materials such as silicon nitride, silicon oxide, silicon oxynitride, or the like, which are deposited. The deposition process may include Chemical Vapor Deposition (CVD), Atomic Layer Deposition (ALD), Plasma-Enhanced Chemical Vapor Deposition (PECVD), or other applicable deposition processes. RDLs/pads 30 may be formed through plating, or alternatively, through damascene processes.

Figure 15:
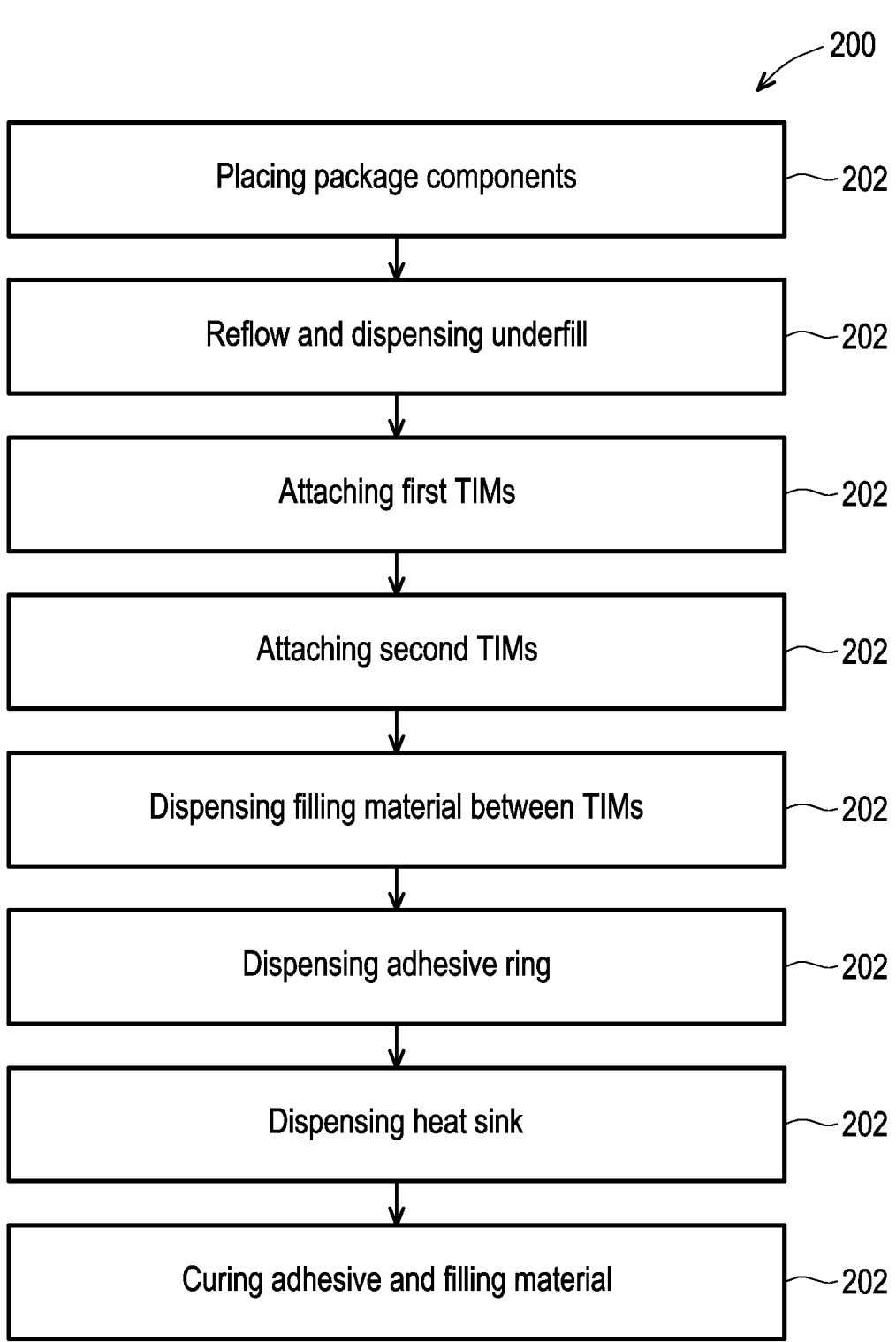
FIG. 15 illustrates a process flow for forming a package in accordance with some embodiments.

Further referring to FIG. 1, packages 32 are placed on package component 20. The respective process is illustrated as process 202 in the process flow 200 as shown in FIG. 15. Although one package 32 is illustrated, a plurality of packages 32 are placed in this process, each being placed over a corresponding one of package components 22. Packages 32 include device dies therein, and may include other package components such as interposers, packages, die stacks, or the like. In accordance with some embodiments, packages 32 include package components 34, 46A, and 46B. In accordance with some embodiments, package components 34 are interposers, which include substrates 36 and the corresponding dielectric layers 38. Accordingly, package components 34 may also be referred to as interposers 34, while package components 34 may also be of other types. The structure of interposers 34 is illustrated schematically, and the details such as the plurality of dielectric layers on the top side and bottom side of substrate 36, metal lines and vias, metal pads, or the like, are not shown. Through-substrate vias 40 (sometimes referred to as through-silicon vias 40 when the substrate 36 is a silicon substrate) penetrate through substrate 36. Through-substrate vias 40 are used to interconnect the conductive features on the top side and the bottom side of substrate 36 to each other. Solder regions 42 may be underlying and joined to interposers, and are used to bond interposers 34 to package component 20. Other bonding schemes such as metal-to-metal direct bonding, hybrid bonding, or the like, may also be used for bonding package components 34 to package component 20.

In accordance with some embodiments, package components 46A and 46B are bonded to the respective underlying package component 34. FIG. 1 illustrates a cross-section wherein one package component 46A and two package components 46B are visible, and are bonded to the same package component 34. Another cross-section view of package 32 may be found in FIG. 9B, which shows that two package components 46A are bonded to the same package component 34 (such as an interposer). Package components 46A and 46B are different types of package components, and are collectively referred to as package components 46.

Each of package components 46 may be a device die, a package with a device die(s) packaged therein, a System-on-Chip (SoC) die including a plurality of integrated circuits (or device dies) integrated as a system, or the like. The device dies in package components 46 may be or may comprise logic dies, memory dies, input-output dies, Integrated Passive Devices (IPDs), or the like, or combinations thereof. For example, the logic device dies in package components 46 may be Central Processing Unit (CPU) dies, Graphic Processing Unit (GPU) dies, mobile application dies, Micro Control Unit (MCU) dies, BaseBand (BB) dies, Application processor (AP) dies, or the like. The memory dies in package components 46 may include Static Random Access Memory (SRAM) dies, Dynamic Random Access Memory (DRAM) dies, or the like. The device dies in package components 46 may include semiconductor substrates and interconnect structures.

In the subsequent discussion in accordance with some example embodiments, package components 46A are referred to as device dies, which may be SoC dies in accordance with some embodiments. Package components 46B may be memory stacks such as High-Performance Memory (HBM) stacks. Package components 46B may include memory dies 60 forming a die stack, and an encapsulant 62 (such as a molding compound) encapsulating memory dies 60 therein. When viewed from top, encapsulant 62 may form a ring encircling memory dies 60, and may also extend into the gaps between memory dies 60.

Further referring back to FIG. 1, package components 46 may be bonded to the underlying package component 34, for example, through solder regions 50. Underfill 54 is dispensed between package components 46 and the underlying package component 34. In accordance with some embodiments, packages 32 are formed through a Chip-on-Wafer (CoW) bonding process, wherein package components 46, which are discrete chips/packages, are bonded to the package components 34 that are in an unsawed wafer to form a reconstructed wafer. After the dispensing of underfills 54, an encapsulant such as molding compound 52 may be applied, followed by a planarization process on the molding compound 52 to level its top surface with the top surfaces of package components 46. A reconstructed wafer is thus formed. The reconstructed wafer is sawed apart to form discrete packages 32, which are bonded to package component 20.

Figure 2:
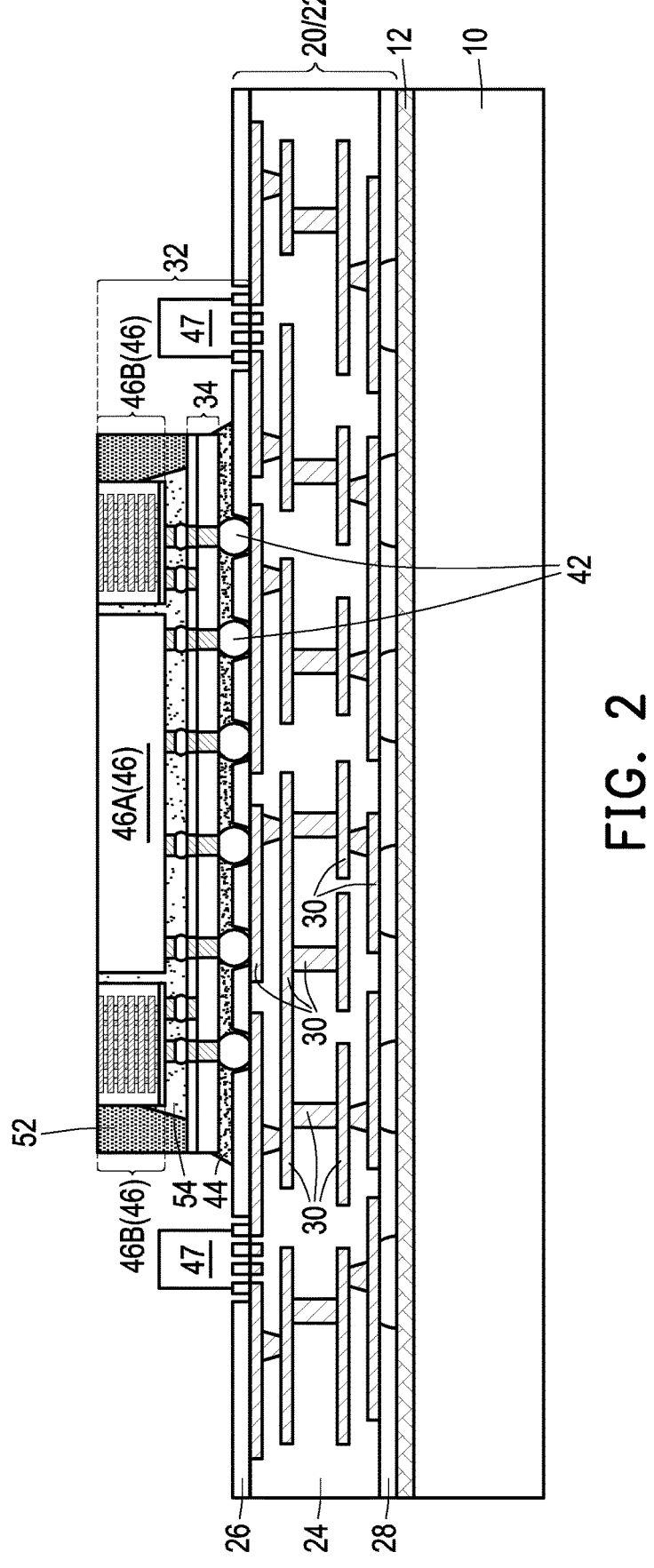

After the placement of packages 32 onto package component 20, solder regions 42 are reflowed, and underfill 44 may be dispensed between the gap between packages 32 and package component 20. The resulting structure is shown in FIG. 2. The respective process is illustrated as process 204 in the process flow 200 as shown in FIG. 15. There may be other package components such as Independent Passive Devices (IPDs) 47 bonding to package component 20. In accordance with some embodiments, IPDs 47 are discrete capacitors, discrete inductors, discrete resistors, or the like, and no active devices such as transistors are formed in IPDs 47.

Figure 9A:
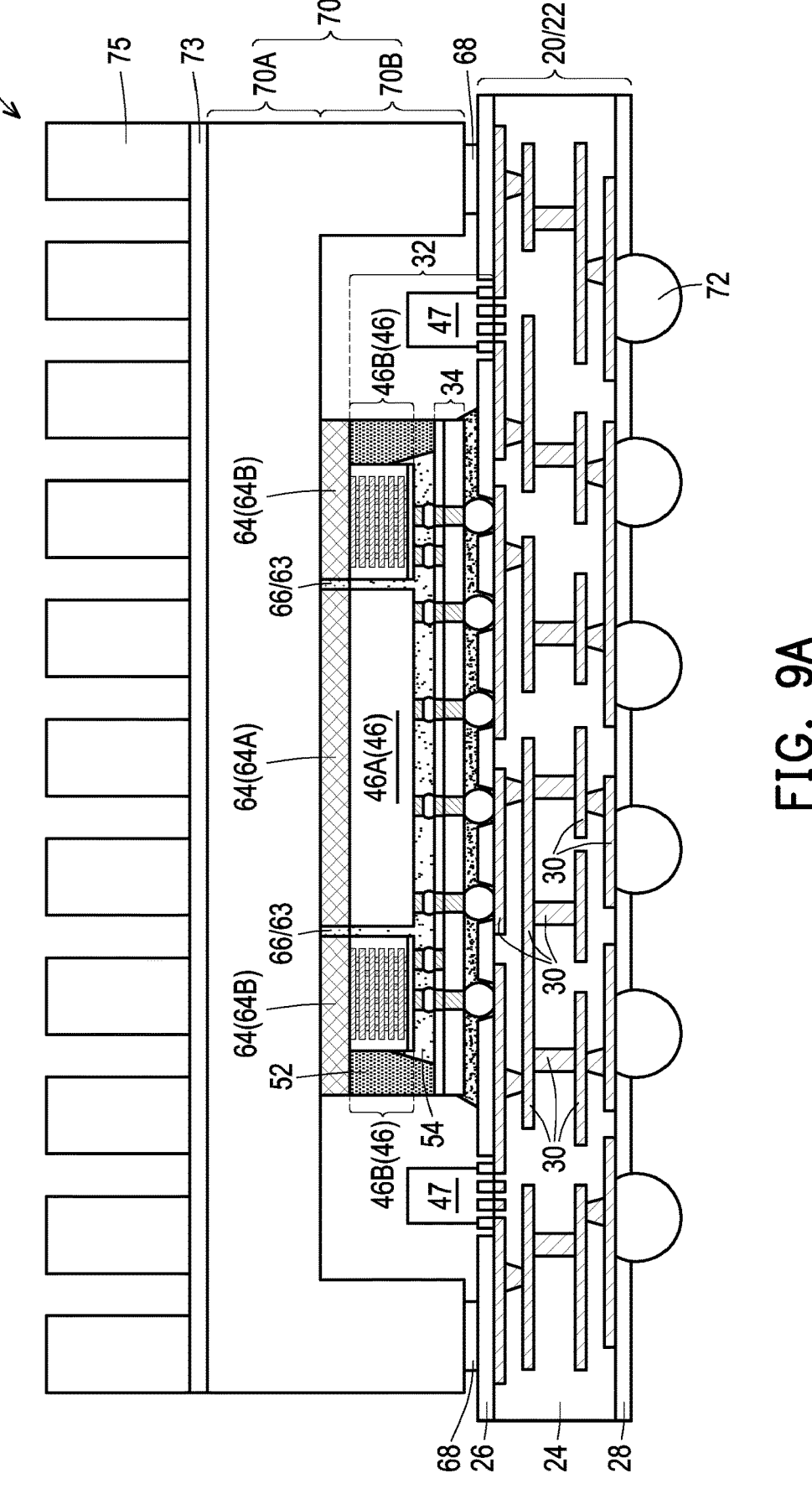
Figure 9B:
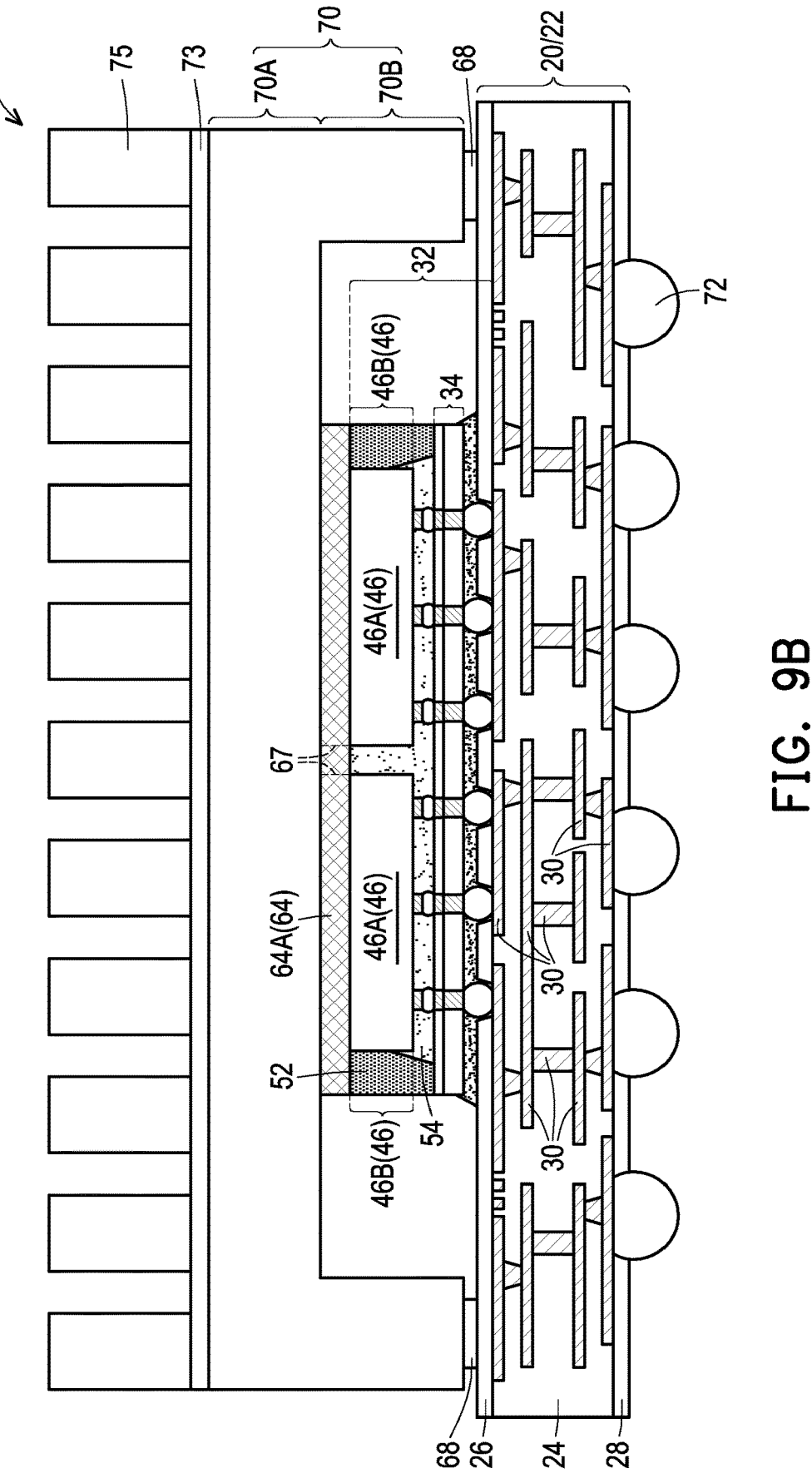
Figure 10:
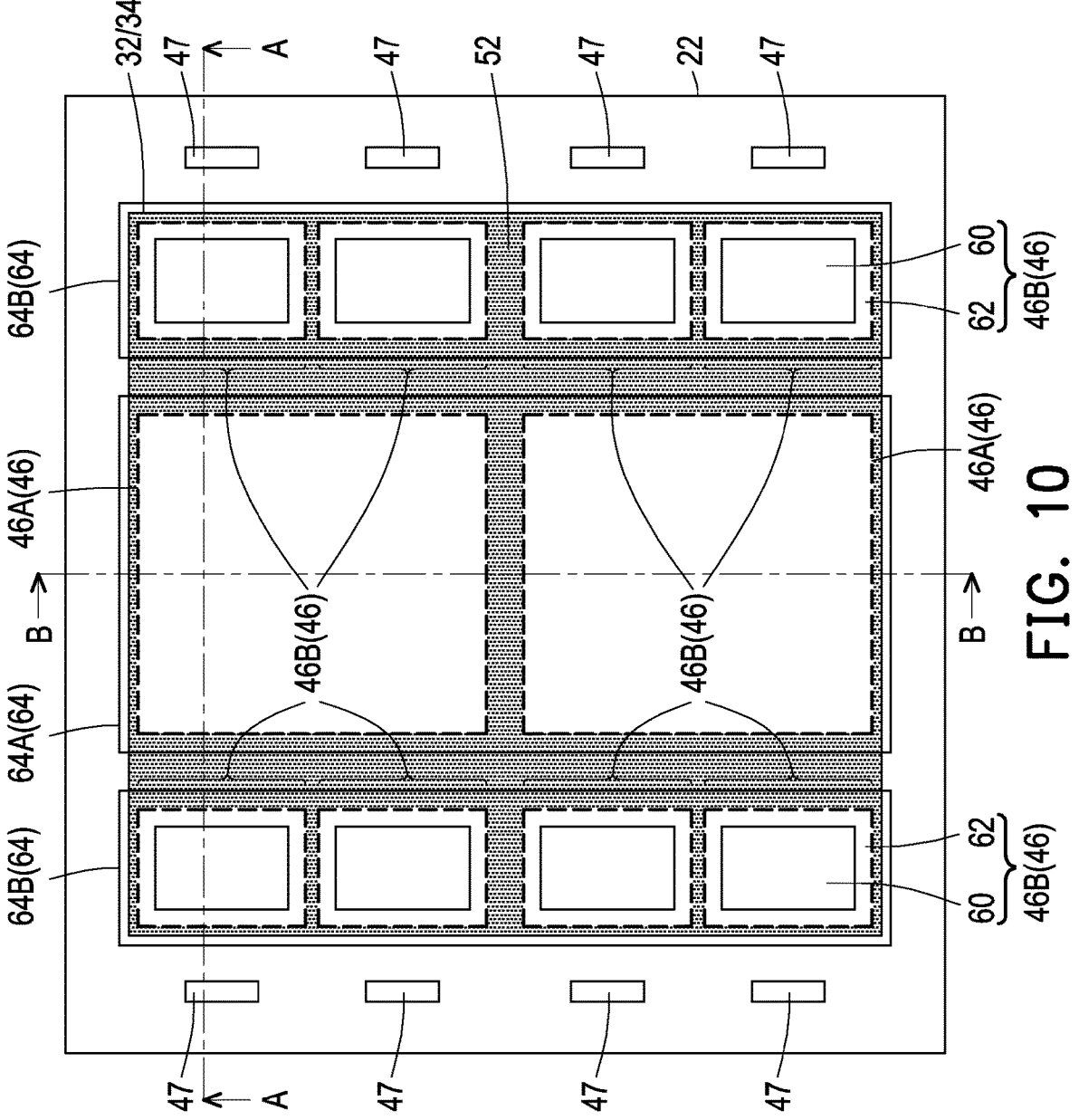
FIG. 10-14 illustrate the top views of package components and thermal interface materials in accordance with some embodiments.

FIG. 10 illustrates an example top view of some features as shown in FIG. 2 (and FIG. 9A) and FIG. 9B. The reference cross-section A-A in FIG. 10 corresponds to the cross-sectional view shown in FIG. 2 and FIG. 9A, and the reference cross-section B-B in FIG. 10 corresponds to the cross-sectional view shown in FIG. 9B. Package 32 may include one or more device die(s) 46A, and a plurality of memory stacks 46B. Each of memory stacks 46B may include stacked memory dies 60 and molding compound 62 molding (and encircling) memory dies 60. Encapsulant (for example, a molding compound) 52 fills the spaces between neighboring package components 46. IPDs 47 may be bonded to the peripheral region of package component 22.

Figure 3:
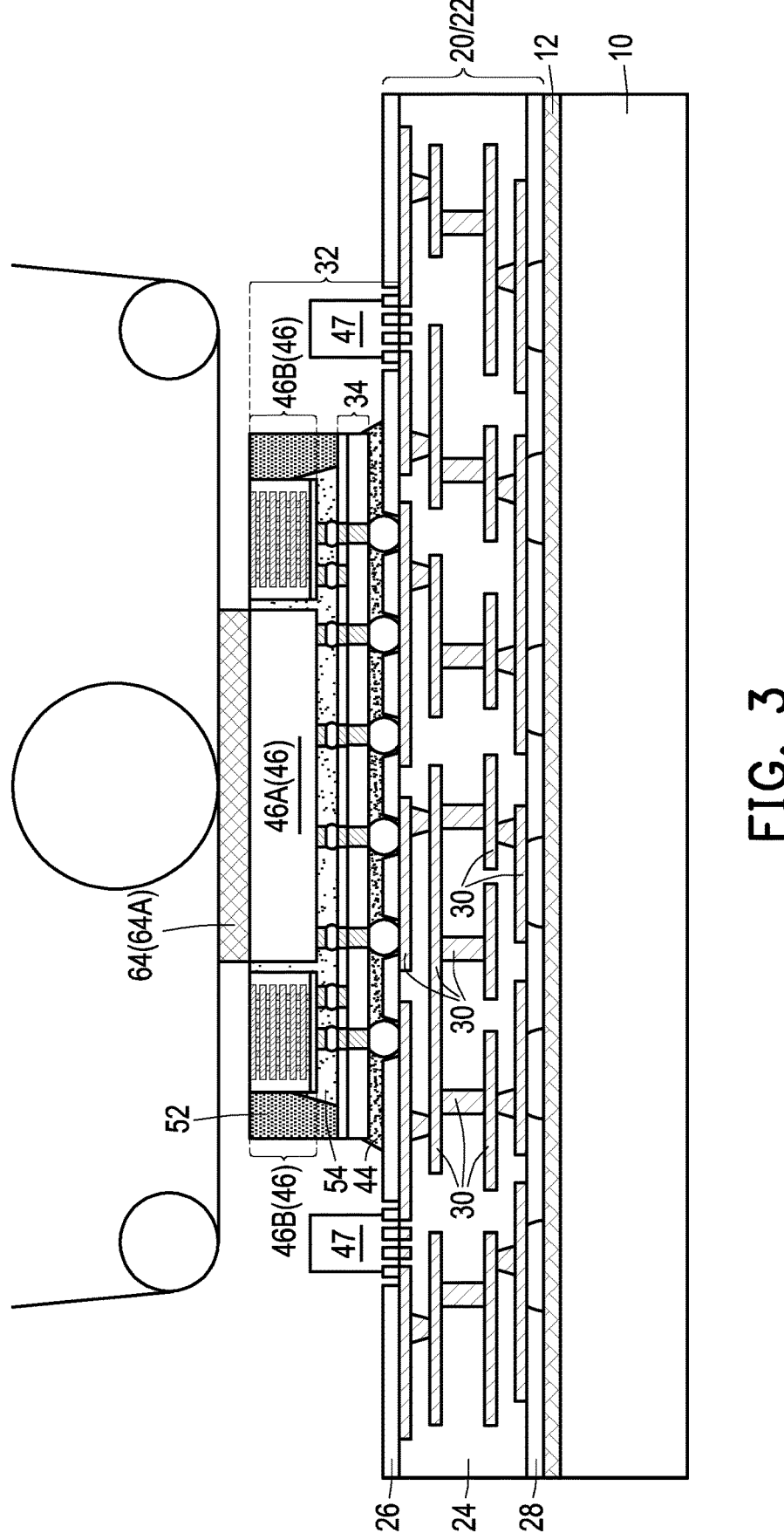

Referring to FIG. 3, TIM 64A is attached to package 32. The respective process is illustrated as process 206 in the process flow 200 as shown in FIG. 15. While one TIM 64A is illustrated, there may be one, two or more TIMs 64A attached to the same package 32. TIM 64A is a film-type TIM, which is a pre-formed solid TIM at the time it is attached to package 32, as compared to liquid-type TIMs that are dispensed in a flowable form and then cured into solid. TIM 64A may be rigid, and is attached through picking and placing. Alternatively, TIM 64A may be a soft film, and may be rolled to the intended place, and is then pushed toward package 32. TIM 64A may have thermal conductivity values higher than about 1 W/k*m, higher than about 5 W/k*m, higher than about 10 W/k*m, or higher. TIM 64A may be in contact with the top surface of device die 46A, and may, or may not, be kept apart from memory stacks 46B. TIM 64A may or may not extend over and contacting the top surface of molding compound 52. In accordance with some embodiments, TIMs 64A have same top-view sizes and top-view areas as, and overlap, the corresponding underlying package components 46A.

Figure 4A:
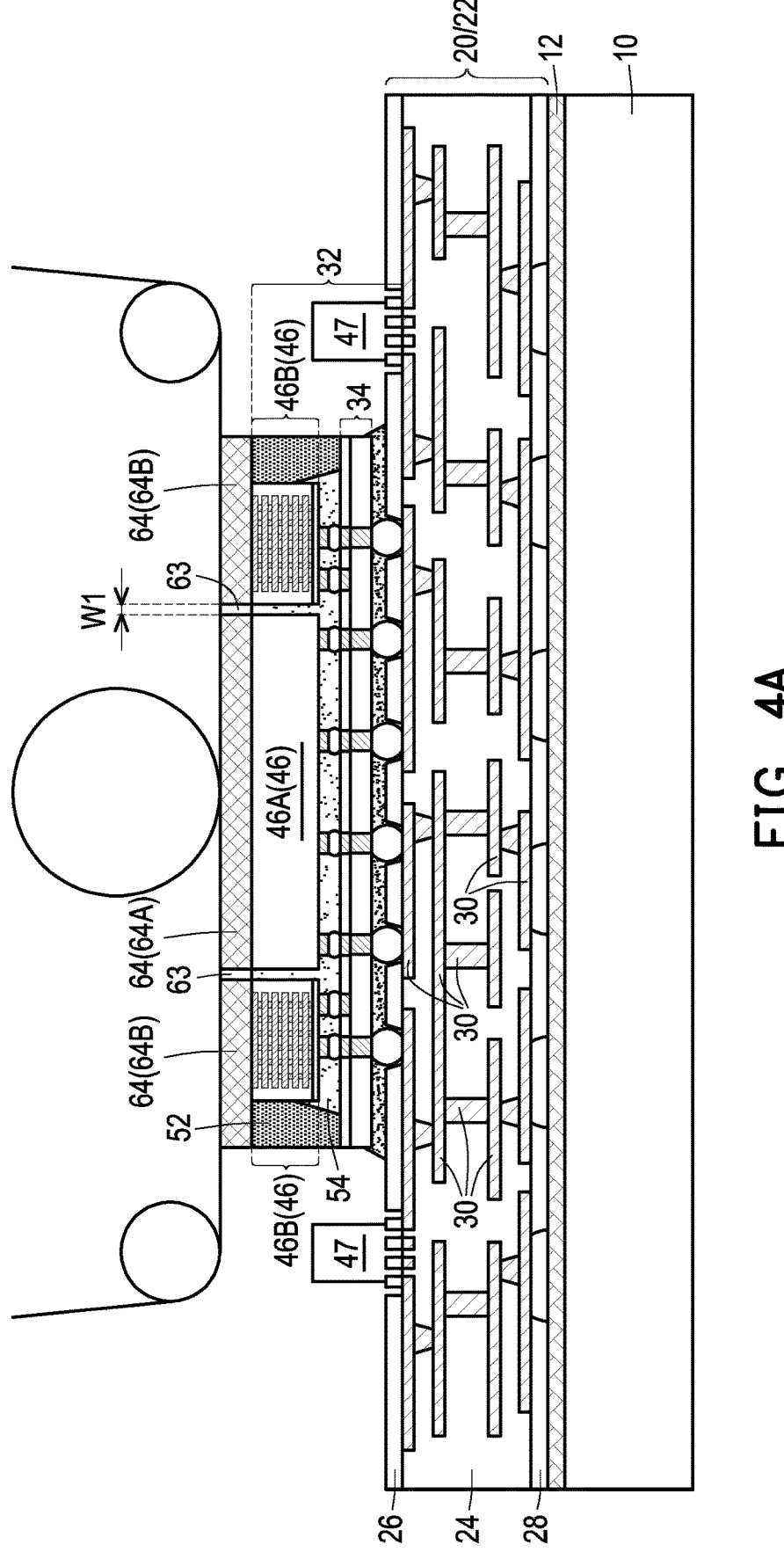

Referring to FIG. 4A, a plurality of TIMs 64B are attached to the same package 32. The respective process is illustrated as process 208 in the process flow 200 as shown in FIG. 15. TIMs 64A and 64B are also collectively referred to as TIMs 64. TIMs 64B may be physically separated from TIM 64A by spaces 63, or may be in physical contact with TIM 64A. The widths W1 of spacings 63 may be in the range between about 0.1 mm and about 10 mm, and may be equal to or different from each other. TIMs 64B are also film-type TIMs, which are solid films. TIMs 64B may be rigid, and are attached through picking and placing. Alternatively, TIMs 64B may be soft films, and may be rolled to the intended place, and are then pushed toward package 32. TIM 64B may also have thermal conductivity values higher than about 1 W/k*m, higher than about 5 W/k*m, higher than about 10 W/k*m, or higher. TIM 64B may or may not extend over and contacting the top surface of molding compound 52. In accordance with some embodiments, TIMs 64B have same top-view sizes and top-view areas as, and overlap, the corresponding underlying package components 46B.

In accordance with some embodiments, TIMs 64A and 64B are formed of different types of TIMs, and comprise different materials and/or have different compositions. Each of TIMs 64A and 64B may include a base-material and filler particles mixed in the base material. The base material may be a polymer-based material, an epoxy-based material, a resin-based material, and/or the like. In accordance with some embodiments, the base material may be selected from an olefin copolymer, an acrylic copolymer, a polyimide-based material, a PBO-based material, a silicone-based material, the mixture thereof, or the like. The filler particles may be formed of or comprise graphite, carbon nano-tube, graphene, aluminum oxide, aluminum nitride, boron nitride, or the like. The volume percentage of polymer may be in the range between about 1 percent and about 80 percent, or between about 20 percent and about 80 percent. The volume percentage of filler particles may be in the range between about 20 percent and about 99 percent. It is appreciated that the materials of the fillers affects the hardness and the elongate value of the TIMs. For example, the TIMs having graphite as the filler is softer, and has greater elongate value than the TIMs having carbon nanotubes as the filler.

It is appreciated that the compositions of TIMs 64A and 64B affect their properties, such as the hardness, the elongation value, the thermal conductivity values, and the like. Throughout the description, if any of the base material, the volume percentage of the base material, the material of the filler, the volume percentage of the filler in TIM 64A is different from that in TIM 64B, it is considered that TIM 64A is different from TIM 64B. In accordance with some embodiments, TIM 64A is different from TIM 64B. The thermal conductivity of TIM 64A is different from, and may be higher than or lower than the thermal conductivity of TIM 64B. The Young's modulus (hardness) of TIM 64A may be equal to, higher than, or lower than, the Young's modulus of TIM 64B. In accordance with alternative embodiments, TIM 64A and TIM 64B are the same as each other.

Figure 4B:
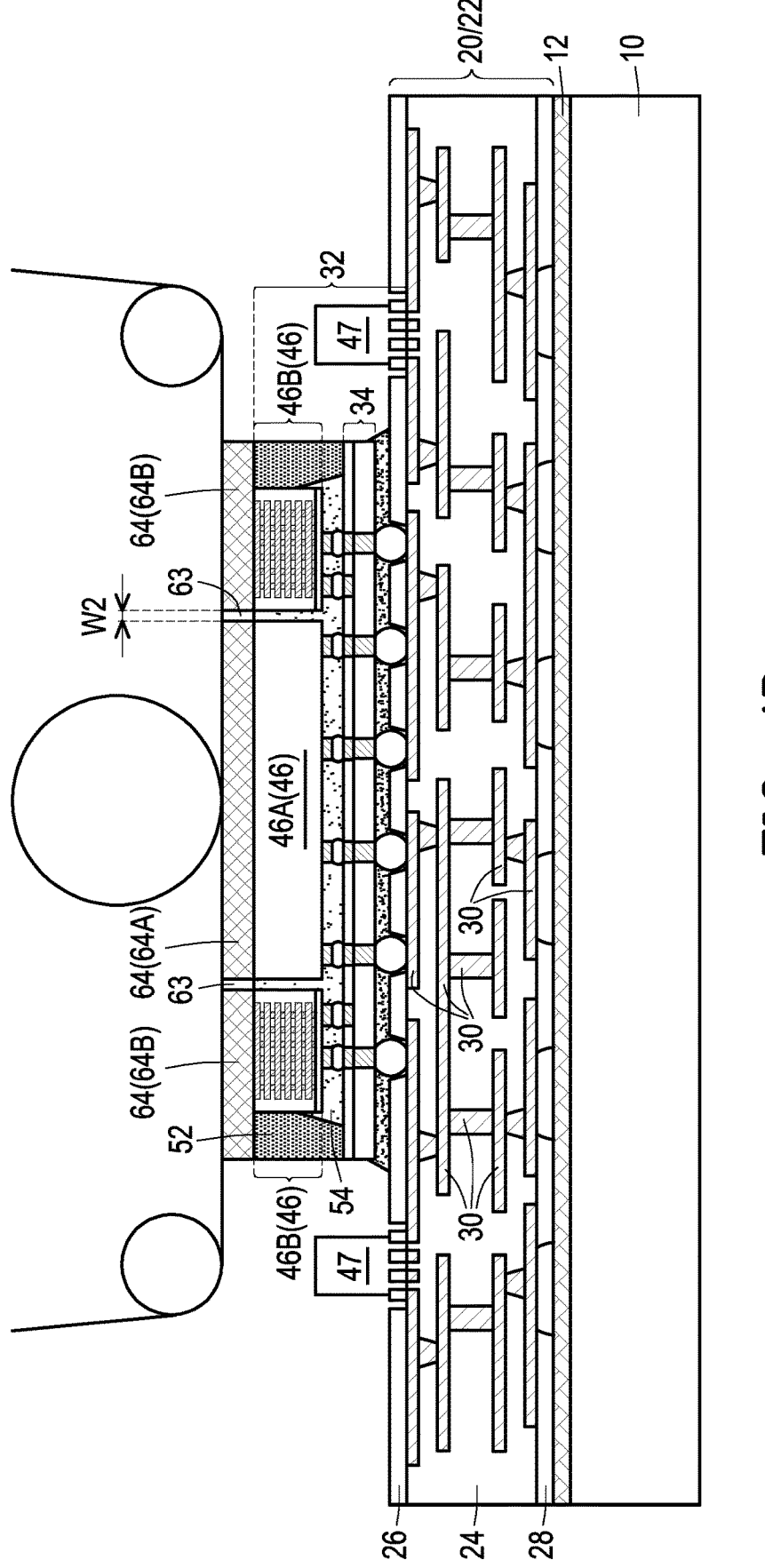

FIG. 4B illustrates the attaching of TIMs 64A and 64B in accordance with alternative embodiments. In accordance with these embodiments, TIMs 64A and 64B are the same type of TIM, and may be attached simultaneously onto package 32 in a same process. Again, TIMs 64A and 64B, although being discrete TIMs, may be spaced apart from each other by spaces 63, or may be in physical contact with each other. The width W2 of spacings 63 may be in the range between about 0.1 mm and about 10 mm.

Figure 4C:
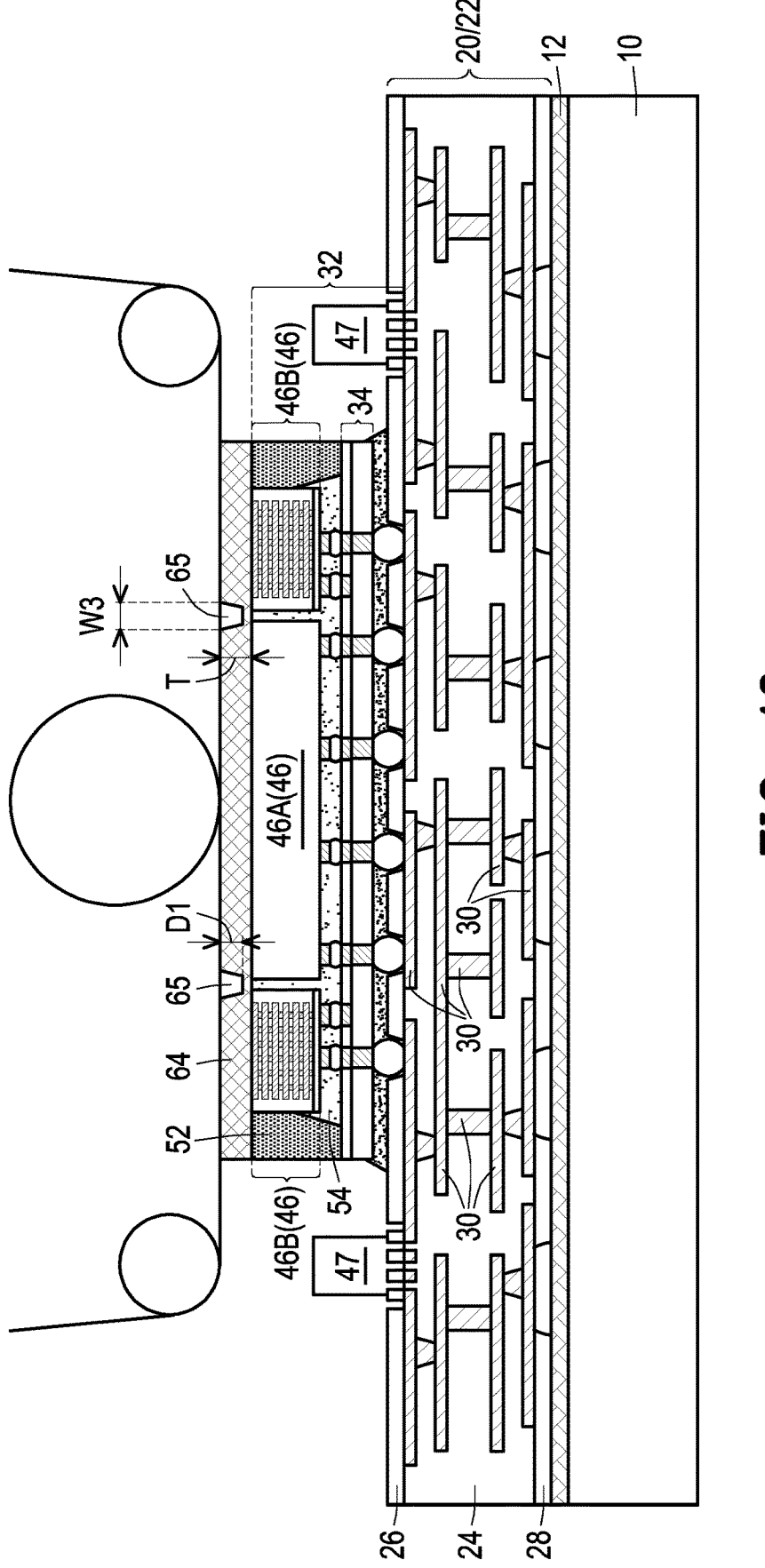

FIG. 4C illustrates the attaching of TIM 64 in accordance with yet alternative embodiments. In accordance with these embodiments, there is a single TIM 64 over each of packages 32. Grooves 65 may be pre-formed in TIM 64, and the grooved TIM 64 is attached to package 32. In accordance with alternative embodiments, TIM 64 is attached on package 32 first, and is then grooved. The depth D1 of grooves 65 may be in the range between about 0.25T1 and about 0.75T1, wherein T1 is the thickness of TIM 64. The width W3 of grooves 65 may be in the range between about 0.1 mm and about 10 mm.

In accordance with some embodiments as shown in FIGS. 4A, 4B, and 4C, the spaces 63 between discrete TIMs 64 or the grooves 65 may be vertically aligned to the spacings between neighboring package components 46. The vicinity of the spaces/grooves is also the regions in which delamination between TIM and the underlying parts of package 32 are more likely to occur due to high stress. By separating the otherwise large TIM (which will cover the entire package 32) into smaller pieces, especially at regions where stress in TIM is high, the delamination between TIMs 64 and the underlying package 32 is significantly reduced.

Figure 5:
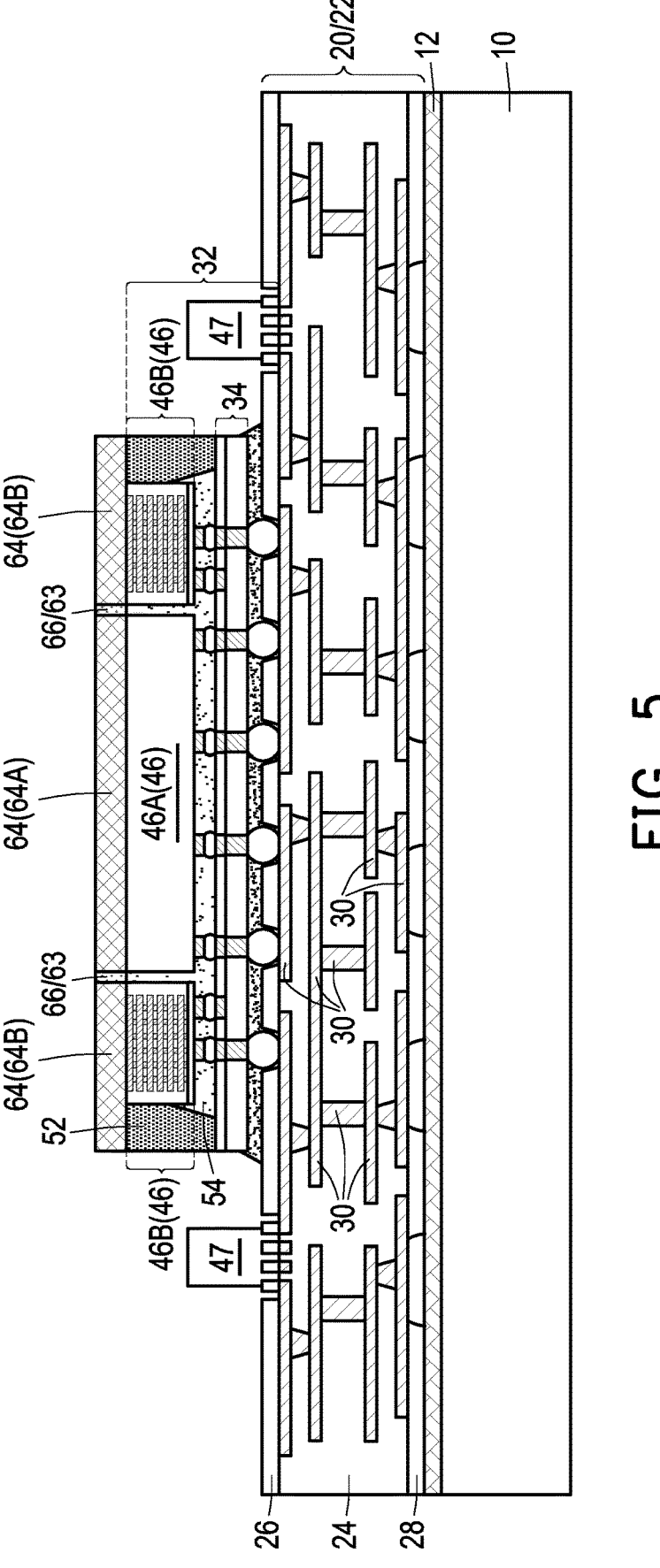

Referring to FIG. 5, a filling material, which may be a gel, is dispensed into the spaces 63 (FIGS. 4A and 4B) between neighboring TIMs 64 in accordance with some embodiments. The respective process is illustrated as process 210 in the process flow 200 as shown in FIG. 15. When grooves 65 are formed as shown in FIG. 4C, filling material 66 may also be filled into grooves 65. In accordance with alternative embodiments, no filling material is dispensed, and in the final package (FIGS. 9A and 9C), air gaps are left in spacings 63 or grooves 65. In accordance with some embodiments, the filling material 66 includes a gel, which may be a polymer-based material. The polymer-based material may include silicone. Filler particles may be mixed in the gel. Alternatively, filling material 66 does not include filler particles. In accordance with some embodiments, the filler particles may include ceramic particles, metal particles, rubber particles, or the like. The candidate filler particle materials for TIMs 64 may also be used in filling material 66. In accordance with some embodiments, filling material 66, after curing, has a Young's modulus lower than the Young's modulus of TIMs 64. Furthermore, the elongation value of filling material 66, after curing, may be greater than the elongation values of TIMs 64. Accordingly, filling material 66 may absorb the stress in the package, and may act as a buffer between TIMs 64.

Figure 6:
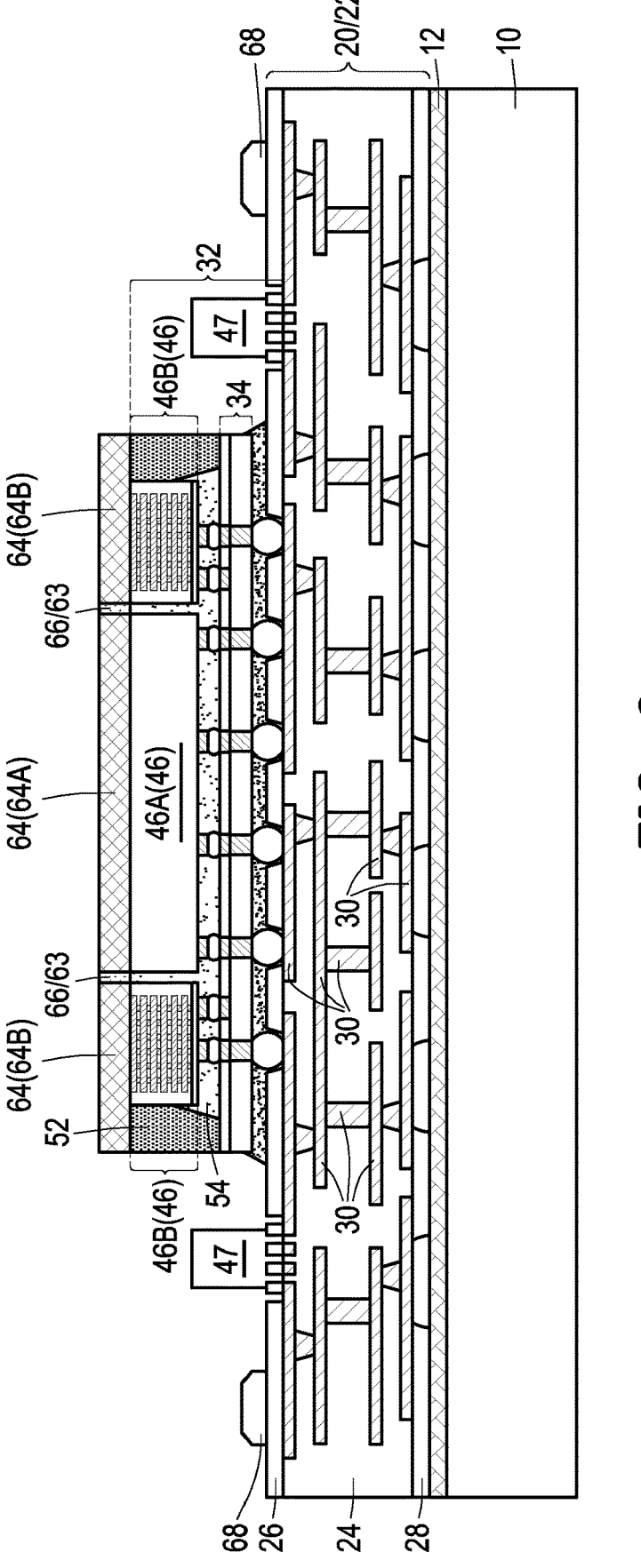

FIG. 6 further illustrates the dispensing of adhesives 68, which are dispensed onto the top surface of package component 22. The respective process is illustrated as process 212 in the process flow 200 as shown in FIG. 15. Adhesives 68 may be dispensed as a ring encircling package 32, or may be dispensed as discrete portions aligning to a ring. The thermal conductivity value of adhesives 68 may be lower than the thermal conductivity of TIMs 64. For example, the thermal conductivity value of adhesives 68 may be lower than about 1 W/k*m, while higher thermal conductivity value is possible. In accordance with alternative embodiments, the process in FIG. 6 is skipped.

Figure 7:
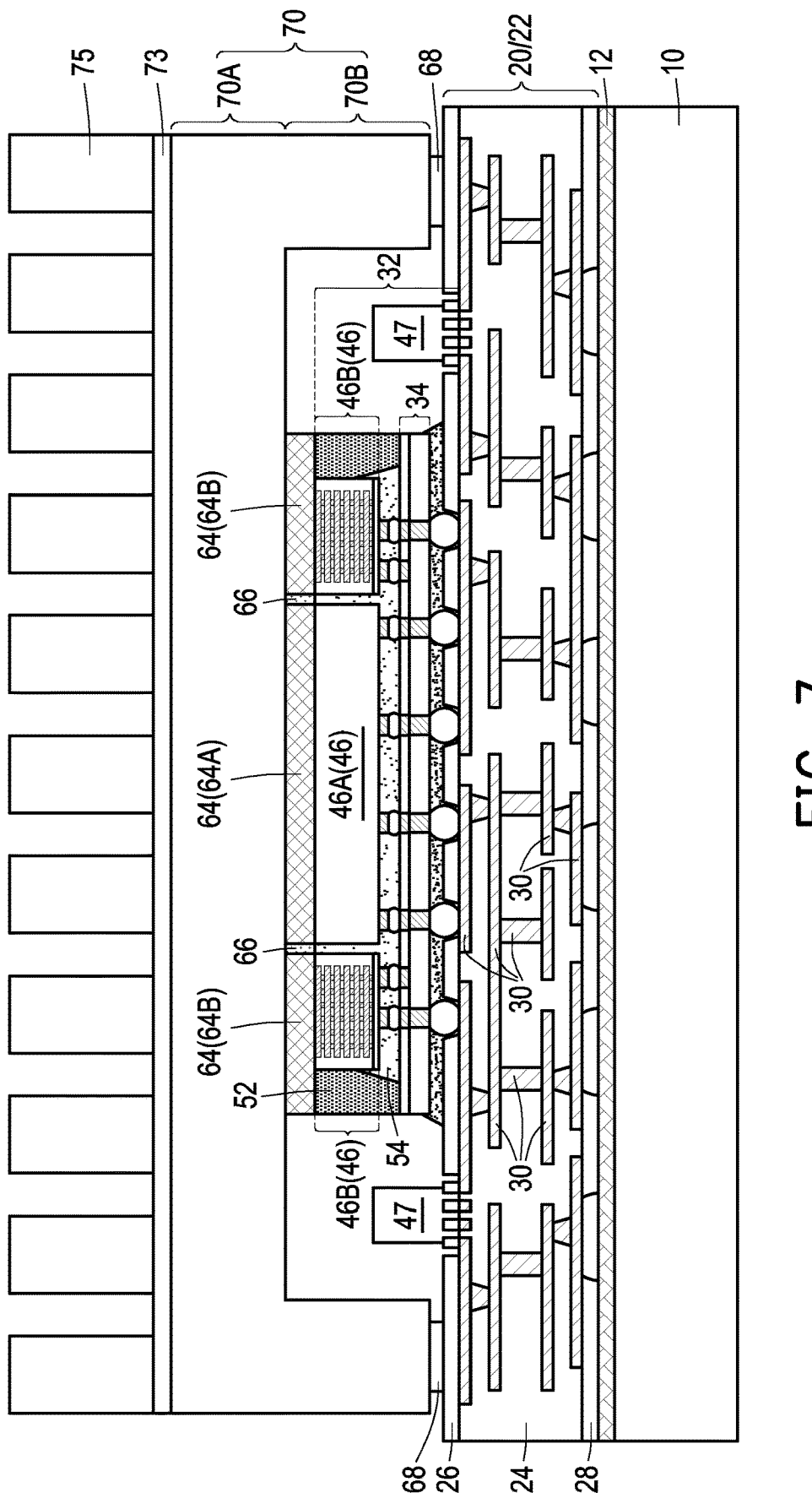

Next, referring to FIG. 7, heat sink 70 (which may also be metal lid) is attached to TIMs 64 on one of package components 22. The respective process is illustrated as process 214 in the process flow 200 as shown in FIG. 15. In accordance with some embodiments, package component 20 is at wafer-level and includes a plurality of package components 22. Accordingly, there are a plurality of heat sinks 70, each being attached to one of package components 22. In accordance with some embodiments, as shown in FIG. 7, heat sink 70 includes an upper portion 70A, with its bottom surface being planar and contacting TIMs 64A and 64B. Heat sink 70 may further include a lower (skirt) portion 70B, which extends down to join adhesives 68 in accordance with some embodiments. The lower portion 70B may form a full ring encircling package 32. In accordance with alternative embodiments, heat sink 70 does not include lower portion 70B. Accordingly, the process for dispensing adhesives, as shown in FIG. 6, may be skipped. In accordance with some embodiments, heat dissipating fins 75 are attached to heat sink 70 through TIM 73. In accordance with alternative embodiments, no heat sink fins are attached. During the attachment of heat sink 70, heat sink 70 is pushed down against adhesives 68 and TIMs 64A and 64B to ensure the physical contact to these features.

A curing process is then performed to solidify adhesives 68. The respective process is illustrated as process 216 in the process flow 200 as shown in FIG. 15. During the curing process, filling material 66 may also be cured. TIMs 64 may also be further hardened, with the adhesion of TIMs 64 to heat sink 79 and package 32 being improved. In accordance with some embodiments, the curing process includes a thermal curing process, which is performed at a temperature in a range between about 125° C. and about 180° C. The curing duration may be in the range between about 30 minutes and about 180 minutes.

Figure 8:
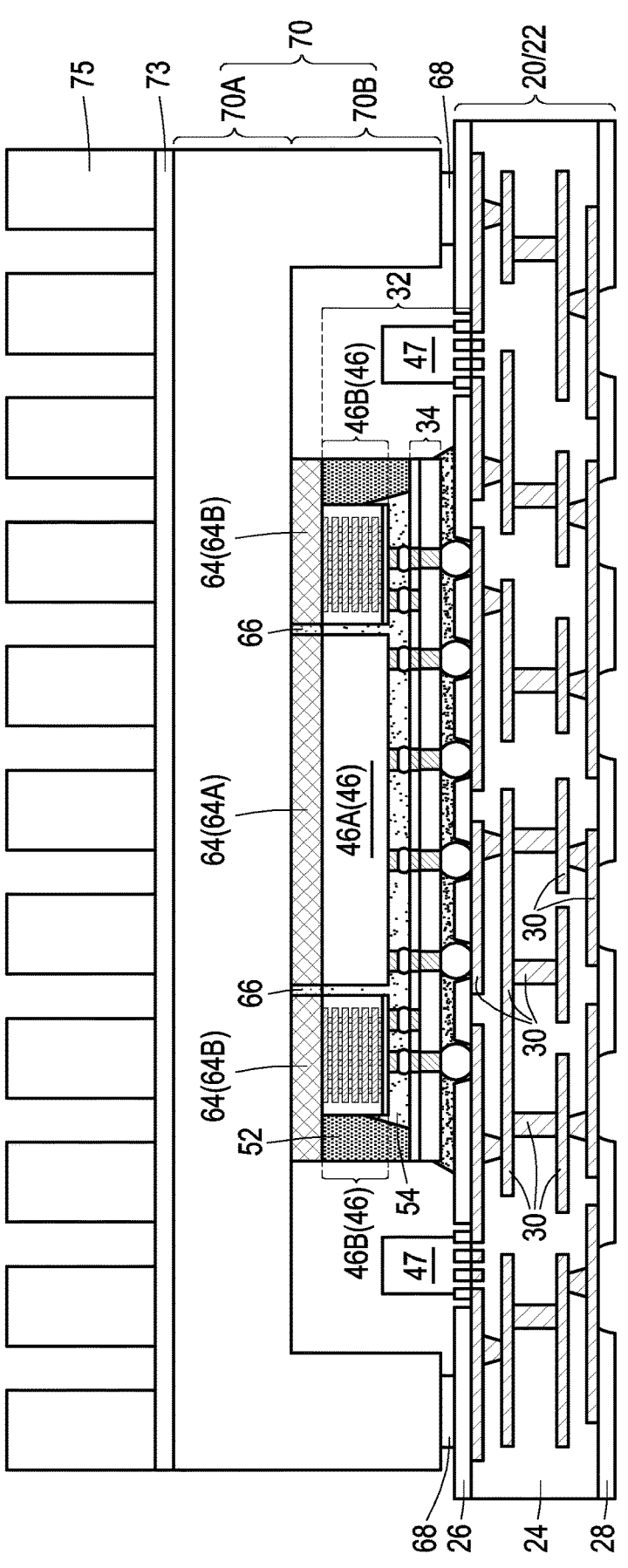

Next, in accordance with some embodiments, package component 20 is de-bonded from carrier 10. In accordance with some embodiments, a light beam such as a laser beam is projected on release film 12, and release film 12 is de-composed under the heat of the light beam. Package component 20 and the overlying structures are thus released from carrier 10. The resulting structure is shown in FIG. 8. Solder regions 72 may be placed on package component 22, and then reflowed. The resulting structure is shown in FIG. 9A.

In a subsequent process, a singulation process may be performed to saw package component 20, so that package components 22 are separated into discrete packages. Each of package components 22 forms a package 76 with the respective overlying package 32 and TIMs 64. The resulting structure is shown in FIG. 9A.

An example top view of the structure shown in FIGS. 9A and 9B is illustrated in FIG. 10. FIG. 9A illustrates a cross-section A-A in the top view as shown in FIG. 10. FIG. 9B illustrates a cross-section B-B in the top view as shown in FIG. 10. In accordance with some embodiments, as shown in FIG. 9B, there are a plurality of package components 46A, and a same TIM 64A extends on the plurality of package components 46A. In accordance with alternative embodiments, there are a plurality of TIMs 64A, and two neighboring package components 46A may be in contact with different TIMs 64A. The dashed lines 67 (FIG. 9B) represent where TIM 64A may be separated.

Figure 9C:
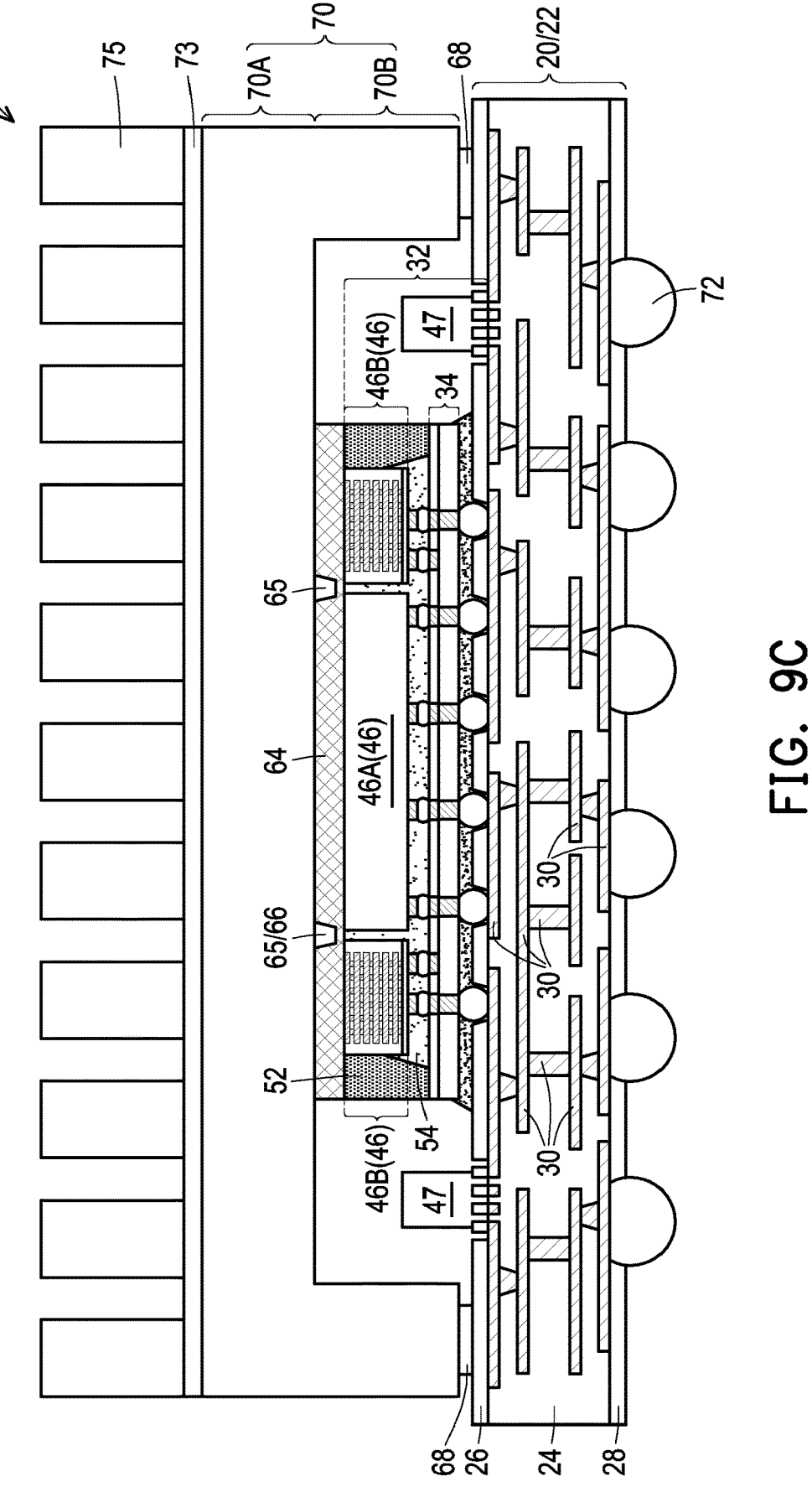
FIG. 9C illustrates a cross-sectional view of a package with grooves formed in a thermal interface material in accordance with some embodiments.

FIG. 9C illustrates cross sectional view, which may also represent the reference cross-section A-A in FIG. 10. These embodiments are similar to the embodiments as shown in FIG. 9A, except that instead of having discrete TIMs 64, a TIM 64 may have grooves 65, which may be filled by filling material 66, or may be left as air grooves.

In the above-discussed embodiments, heat sinks 70 are attached on package components first, and then package component 20 is detached from carrier 10, followed by sawing package component 20. In accordance with alternative embodiments, package component 20 is detached from carrier 10 first, followed by sawing package component 20 to separate package components 74, and then heat sinks 70 may be attached to discrete package components 22.

FIGS. 10 through 14 illustrate the top views of package components 46A and 46B and TIMs 64A and 64B in accordance with some embodiments of the present disclosure. FIG. 10, in addition to package components 46A and 46B and TIMs 64A and 64B, also illustrates package component 22 (such as a package substrate), package component 34 (such as an interposer), package 32, and IPDs 47. In addition, device dies 60 and encapsulant 62, which may be parts of memory stacks 46B, are also illustrated. These components are not shown in FIGS. 11 through 14, while these components also exist in the structure shown in FIG. 11 through 14. Also, although FIGS. 10-14 illustrate the separated TIMs 64A and 64B, the TIMs 64A and 64B may also be replaced with a single TIM, with grooves formed at the locations where TIMs 64A and 64B are spaced apart from each other. Furthermore, for easy distinction purpose, TIMs 64 are illustrated as extending beyond the edges of the corresponding edges of the underlying package components 46, while TIMs 64 may also have their edges laterally recessed from the edges of the corresponding edges of the underlying package components 46, or vertically aligned to the corresponding edges of the underlying package components 46.

In accordance with some embodiments, there are different types of package components, which may have different heat dissipation levels. For example, a SoC die (such as a package component 46A) may generate more heat per unit area than a memory stack (such as a memory stack 46B). Also, a package component such as 46A may include first parts and second parts, with the first parts generating more heat per unit area than second parts. Accordingly, there exist (relatively) higher heat-generating package components/parts and (relatively) lower heat-generating package components/parts. In accordance with some embodiments, the TIMs 64 includes (relatively) high thermal conductivity TIMs (such as 64A) and (relatively) low thermally conductive TIMs (such as 64B) having lower thermal conductive values than the high thermal conductivity TIMs. In accordance with some embodiments, the thermal conductive values of the high thermal conductivity TIMs may be in the range between about 40 W/mK and about 100 W/mK, while the thermal conductive values of the low thermal conductivity TIMs may be in the range between about 10 W/mK and about 30 W/mK.

The high thermal conductivity TIMs, due to the hard fillers mixed therein, may be harder than the low thermal conductivity TIMs. For example, the hardness of the high thermal conductivity TIMs may be in the range between about 40 Asker-C and about 100 Asker-C, while the hardness of the low thermal conductivity TIMs may be in the range between about 10 Asker-C and about 40 Asker-C. Furthermore, the high thermal conductivity TIMs, due to the hard fillers mixed therein, may also have lower compressibility than the low thermal conductivity TIMs. For example, the compressibility of the high thermal conductivity TIMs may be in the range between about 0 percent and about 20 percent, while the compressibility of the low thermal conductivity TIMs may be in the range between about zero percent and about 50 percent.

In accordance with some embodiments, over a same package 32, there may be a single type of TIMs, which are separated from each other or grooved. In accordance with alternative embodiments, over a same package 32, there may be two or more different type of TIMs, which are separated from each other. In the following discussion of some example embodiments as shown in FIGS. 10 through 14, it is assumed that package components 46A are high heat-generating components, while package components 46B are low heat-generating components. Also, it is assumed that TIMs 64A have thermal conductivity values TC64A, while TIMs 64B have thermal conductivity values TC64B lower than conductivity values TC64A. Also, TIMs 64A (and/or 64B) may have their edges extending beyond, overlapping, or recessed from, the corresponding edges of the respective underlying package components 46A (and/or 46B).

Referring to FIG. 10, two package components 46A are illustrated. One TIM 64A covers both of package components 46A. There are two TIMs 64B, each covering a plurality of package components 46B. In accordance with some embodiments, TIMs 64A and 64B are different from each other, and the thermal conductivity value TC64A of TIMs 64A is higher than the thermal conductivity value TC64B of TIMs 64B. Accordingly, TIMs 64A is efficient in conducting the heat generated in the high heat-generating components 46A. TIMs 64A is on a part of the surface of package 32 that is mostly formed of silicon, so that the great hardness and low compressibility of TIMs 64A is not a significant concern for causing delamination of TIMs 64A from the underlying package 32. On the other hand, TIMs 64B are over the portions of package 32 that has more molding compound, and has more corners and more complex surface conditions. Accordingly, delamination is more likely to occur. With TIMs 64B having low hardness and higher compressibility, the delamination of TIMs 64B from the underlying portions of package 32 is less likely to occur. Since package components 46B are low heat-generating components, the low thermal conductivity value TC64B of TIMs 64B is not a significant concern. Furthermore, even if TIMs 64A and 64B are formed of a same TIM material, with the reduction in the sizes of the TIMs, and further with the breaking of TIM where the surface condition of package component 22 changes, the stress in the separated TIMs will be smaller than the otherwise large TIM. The delamination is also reduced. The requirement of heating dissipation and the requirement of reducing delamination are balanced and optimized.

In accordance with alternative embodiments, TIMs 64A and 64B are formed of the same type of TIM, and the thermal conductivity value TC64A of TIMs 64A is equal to the thermal conductivity value TC64B of TIMs 64B, and their hardness values are equal to each other.

Figure 11:
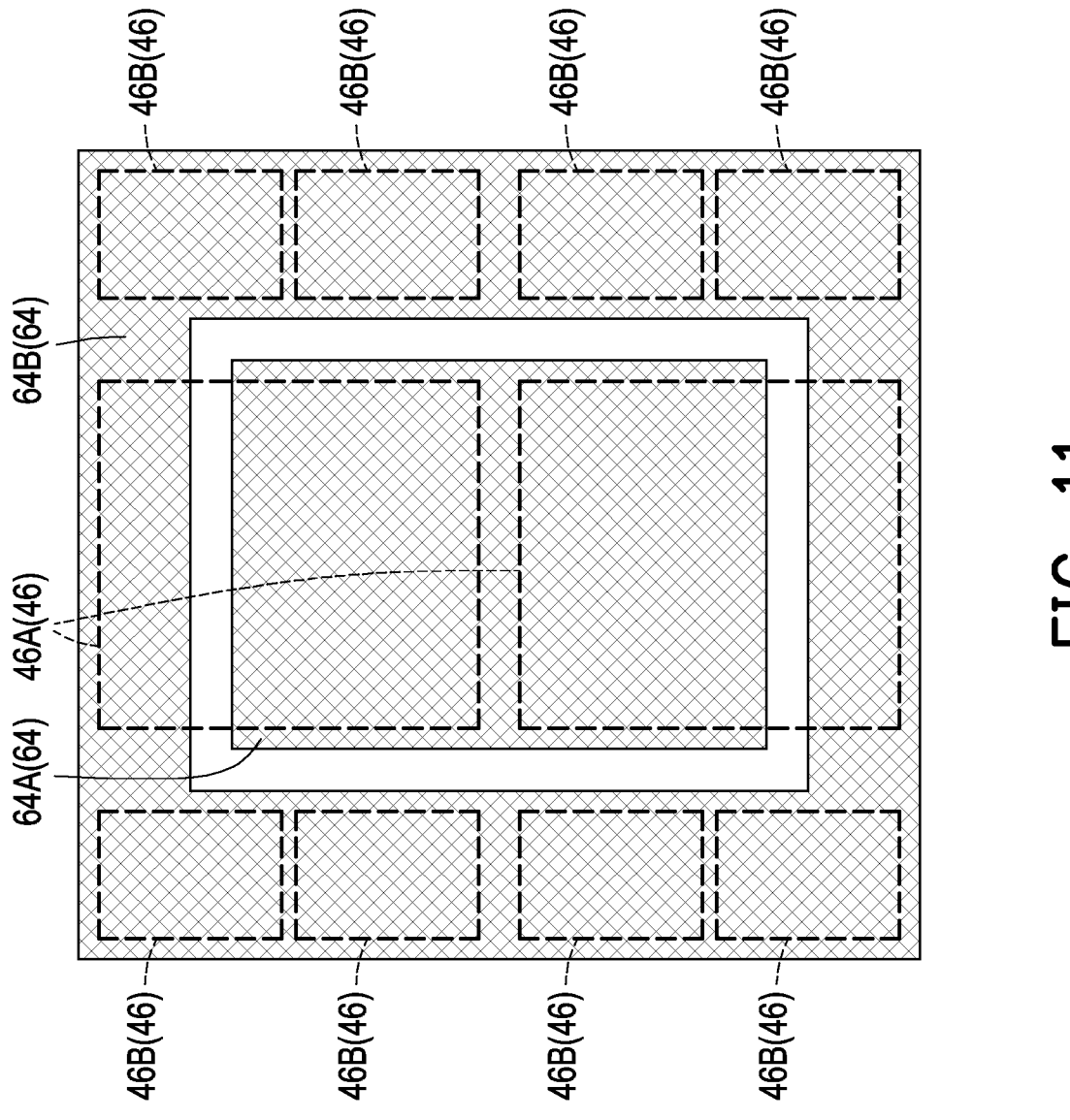

FIG. 11 illustrates an embodiment in which a TIM 64A covers some portions, but not all, of the high heat-generating package components 46A. The covered portion may be high heat-generating portions. TIM 64B may form a ring encircling TIM 64A. TIM 64B may cover package components 46B and the low heat-generating portions of package components 46B. In accordance with some embodiments, TIMs 64A and 64B are different from each other, and the thermal conductivity value TC64A of TIMs 64A is higher than the thermal conductivity value TC64B of TIMs 64B. The hardness value of TIMs 64A is also higher than the hardness value of TIMs 64B. In accordance with alternative embodiments, TIMs 64A and 64B are formed of the same TIM, and the thermal conductivity value TC64A of TIMs 64A is equal to the thermal conductivity value TC64B of TIMs 64B, and their hardness values are equal to each other.

Figure 12:
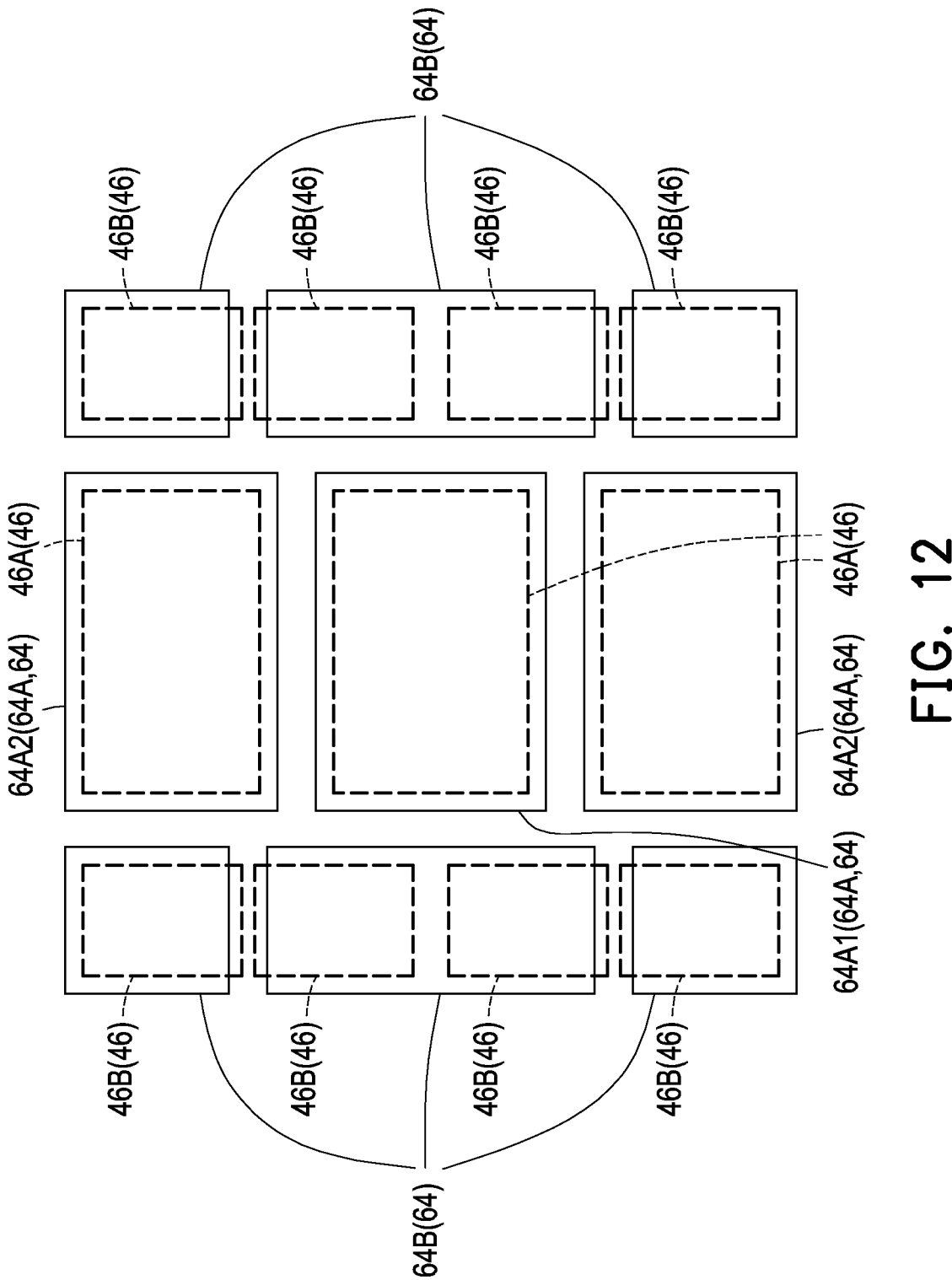

FIG. 12 illustrates an embodiment including a plurality of package components 46A and 46B, and a plurality of TIMs 64A1, 64A2, and 64B. These embodiments are similar to the embodiments as shown in FIG. 10, except that instead of having one TIM 64A, there are a plurality of TIMs 64A1 and 64A2, each covering one of package components 46A. Also, each of TIMs 64B may cover one or two package component 46B, rather than all package components 46B on the same side of package components 46A. In accordance with some embodiments, TIMs 64A1 and 64A2 are the same, and are different from TIM 64B. The thermal conductivity value TC64A1 of TIM 64A1 and TC64A2 of TIM 64A2 are equal to each other, and are higher than the thermal conductivity value TC64B of TIMs 64B. The hardness values of TIMs 64A1 and 64A2 may also be higher than the hardness value of TIMs 64B. In accordance with alternative embodiments, TIMs 64A1, 64A2, and 64B are all different from each other, and the thermal conductivity value TC64A1 of TIM 64A1 is higher than the thermal conductivity value TC64A2 of TIM 64A2, which is further higher than the thermal conductivity value TC64B of TIM 64B. The hardness of TIM 64A1 is also higher than the hardness of TIM 64A2, which is also higher than the hardness of TIMs 64B. In accordance with alternative embodiments, TIMs 64A1, 64A2, and 64B are formed of the same TIM, and their thermal conductivity values TC64A1, TC64A2, and TC64B are equal to each other, and their hardness values are equal to each other.

Figure 13:
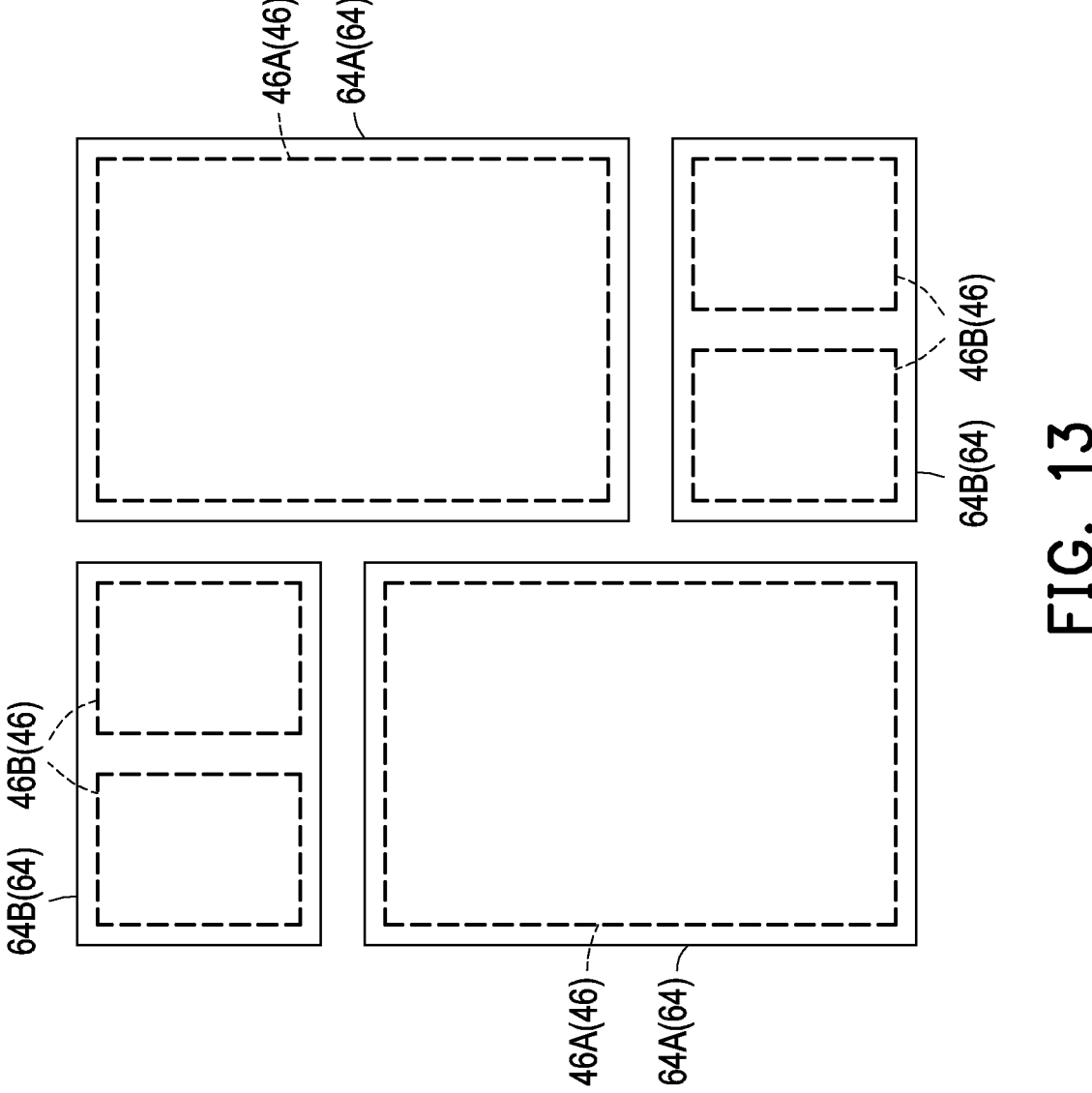

FIG. 13 illustrates an embodiment including a plurality of package components 46A and 46B, and a plurality of TIMs 64A and 64B. These embodiments are similar to the embodiments as shown in FIG. 10, except that package components 46A, instead of being allocated between package components 46B, are allocated to two corners of the corresponding package component 34 (not shown). Package components 46B occupy the other two corners. TIMs 64A and 64B are arranged accordingly to cover the corresponding package components 46A and 46B. In accordance with some embodiments, TIMs 64A and 64B are different from each other, and the thermal conductivity value TC64A of TIMs 64A is higher than the thermal conductivity value TC64B of TIMs 64B. The hardness values of TIMs 64A are also higher than the hardness values of TIMs 64B. In accordance with alternative embodiments, TIMs 64A and 64B are formed of the same TIM, and the thermal conductivity value TC64A of TIMs 64A is equal to the thermal conductivity value TC64B of TIMs 64B, and their hardness values are equal to each other.

Figure 14:
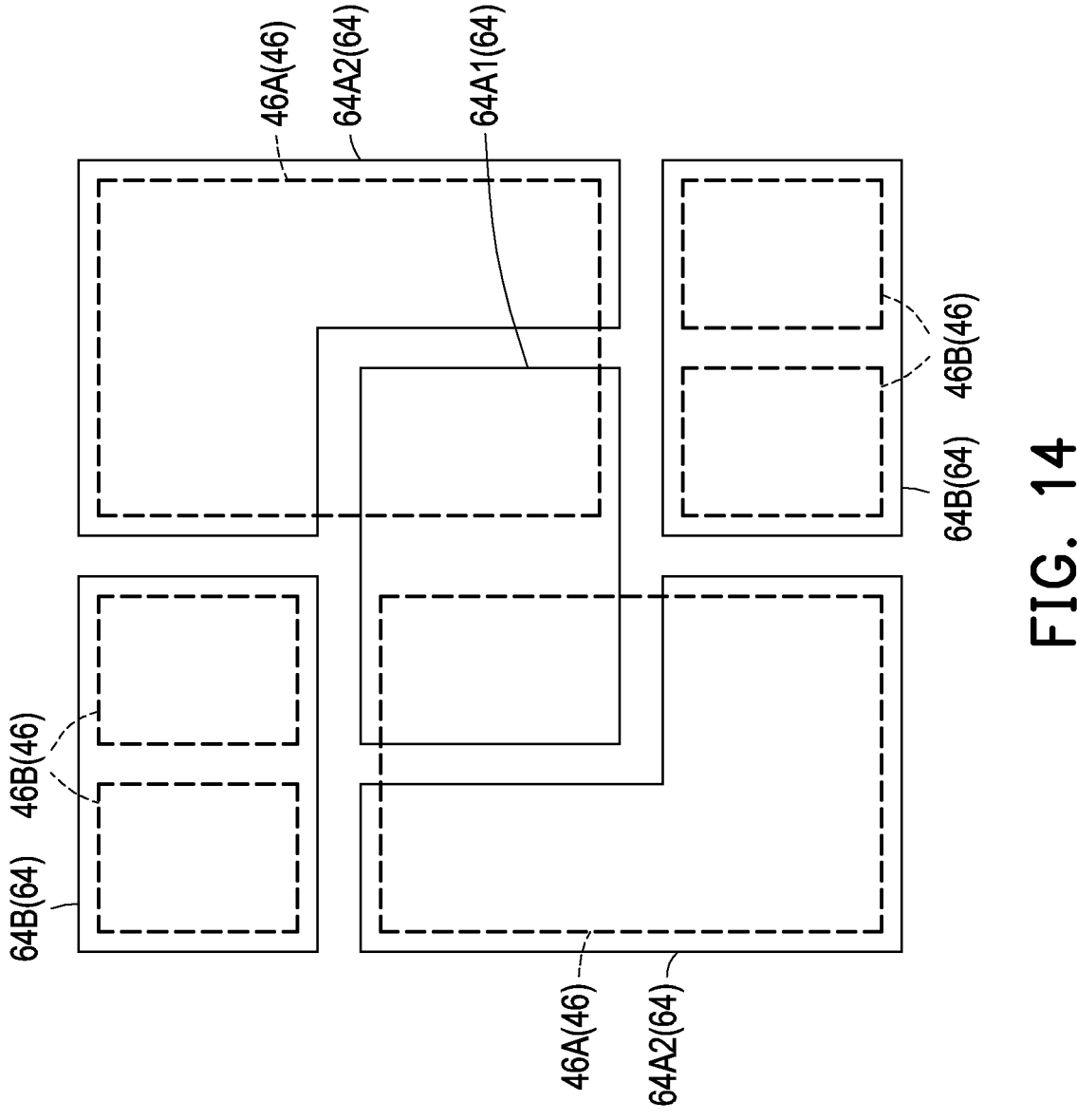

FIG. 14 illustrates an embodiment including a plurality of package components 46A and 46B, and a plurality of TIMs 64A and 64B. These embodiments are similar to the embodiments as shown in FIG. 13, except that there are three types of TIMs 64A1, 64A2, and 64B.

In accordance with some embodiments, TIMs 64A1 and 64A2 are the same, and are different from TIM 64B, and the thermal conductivity value TC64A1 of TIMs 64A1 and TC64A2 of TIMs 64A2 are equal to each other, and are higher than the thermal conductivity value TC64B of TIMs 64B. The hardness values of TIMs 64A1 and 64A2 are also higher than the hardness values of TIMs 64B. In accordance with alternative embodiments, TIMs 64A1, 64A2, and 64B are all different from each other, and the thermal conductivity value TC64A1 of TIMs 64A1 is higher than the thermal conductivity value TC64A2 of TIMs 64A2, which is further higher than the thermal conductivity value TC64B of TIMs 64B. The hardness of TIMs 64A1 is also higher than the hardness of TIMs 64A2, which is also higher than the hardness of TIMs 64B. In accordance with yet alternative embodiments, TIMs 64A1, 64A2, and 64B are formed of the same TIM, and their thermal conductivity values TC64A1, TC64A2, and TC64B are equal to each other, and their hardness values are equal to each other.

By adopting the embodiments of the present disclosure, the warpage of the packages may be reduced, and delamination may be reduced. Experiments have been performed to form four sample packages. The first sample package has a conventional single-piece TIM (without being separated into pieces). The first sample package does not include adhesive ring 68 and heat sink portion 70B (FIG. 9A). The second sample package has a conventional single-piece TIM also, and further includes adhesive ring 68 and heat sink portion 70B (FIG. 9A). The third sample package includes multiple TIMs, and does not include adhesive ring 68 and heat sink portion 70B (FIG. 9A). The fourth sample package includes multiple TIMs, and includes adhesive ring 68 and heat sink portion 70B (FIG. 9A). The TIM coverage of the four sample packages have been measured, wherein the TIM coverage indicates how much percent of the TIM area that are supposed to adhere to the underlying features actually adheres with no delamination, and 100 percent indicates no delamination at all. The TIM coverage of the first sample package, the second sample package, the third sample package, and the fourth sample package are 76 percent, 93 percent, 99 percent, and 99 percent, respectively. Accordingly, by adopting the multi-TIM structures, the TIM coverage of the packages formed in accordance with the embodiments of the present disclosure (regardless of whether adhesive ring is used or not) is better than the conventional packages, with or without adhesive ring.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By attaching multiple TIMs over the same package, the stress in the TIMs may be reduced, and the delamination between TIMs and the underlying package is reduced. Furthermore, by adopting TIMs formed of different TIM materials, the requirement of improving heat-dissipation and reducing delamination can be balanced.

In accordance with some embodiments of the present disclosure, a method comprises placing a package comprising a first package component; a second package component; and an encapsulant encapsulating the first package component and the second package component therein; attaching a first thermal interface material over the first package component; attaching a second thermal interface material different from the first thermal interface material over the second package component; and attaching a heat sink over both of the first thermal interface material and the second thermal interface material. In an embodiment, the attaching the first thermal interface material and the attaching the second thermal interface material are performed by separate processes. In an embodiment, the first thermal interface material and the second thermal interface material comprise same elements and have different compositions. In an embodiment, the first thermal interface material and the second thermal interface material are discrete thermal interface materials. In an embodiment, the first thermal interface material and the second thermal interface material are physically spaced apart from each other by an air space, and the method further comprises dispensing a filling material into the air space. In an embodiment, the first thermal interface material and the second thermal interface material are physically spaced apart from each other by an air space, and the heat sink is over the air space. In an embodiment, the first thermal interface material and the second thermal interface material are in physical contact with each other. In an embodiment, the first package component has a higher heat-generating ability than the second package component, and the first thermal interface material has a higher thermal conductivity value than the second thermal interface material. In an embodiment, the first package component is harder than the second thermal interface material. In an embodiment, the package is placed on a package substrate, and the method further comprises bonding the package to the package substrate; and dispensing an adhesive ring on the package substrate, wherein the heat sink is further attached to the package substrate through the adhesive ring. In an embodiment, the first thermal interface material and the second thermal interface material are pre-formed films that are formed as solid before being attached to the first package component and the second package component.

In accordance with some embodiments of the present disclosure, a package comprises a first package component comprising a second package component; a third package component; and an encapsulant encapsulating the second package component and the third package component therein; a first thermal interface material over and contacting the second package component; a second thermal interface material over and contacting the third package component; and a heat sink over and in contact with both of the first thermal interface material and the second thermal interface material. In an embodiment, the first thermal interface material and the second thermal interface material comprise different materials. In an embodiment, the first thermal interface material and the second thermal interface material are physically discrete thermal interface material. In an embodiment, the first thermal interface material and the second thermal interface material are physically spaced apart from each other by an air gap. In an embodiment, the package further comprises a filling material separating, and in contact with both of, the first thermal interface material and the second thermal interface material. In an embodiment, the filling material comprises a gel and filler particles in the gel.

In accordance with some embodiments of the present disclosure, a package comprises a first device die; a second device die; a first thermal interface material over and contacting the first device die, wherein the first thermal interface material has a first thermal conductivity value; and a second thermal interface material over and contacting the second device die, wherein the second thermal interface material has a second thermal conductivity value greater than the first thermal conductivity value. In an embodiment, the package further comprises a molding compound molding the first device die and the second device die therein, wherein both of the first thermal interface material and the second thermal interface material contact the molding compound. In an embodiment, the first device die is a logic die, and the second device die is a memory die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a package component comprising:
      a first device die;
      a second device die;
      an underfill between and contacting the first device die and the second device die; and
      an encapsulant encapsulating the first device die and the second device die therein;
   a thermal interface material over and contacting the first device die and the second device die, wherein the thermal interface material comprises a first groove therein, and wherein a bottom of the first groove is higher than a bottom surface of the thermal interface material, and lower than a top surface of the thermal interface material;
   a filling material filling the first groove, wherein the filling material is physically separated from the underfill by a first portion of the thermal interface material; and
   a heat sink over and contacting the thermal interface material.

2. The package of claim 1, wherein the filling material comprises a gel.

3. The package of claim 2, wherein the gel comprises a polymer-based material.

4. The package of claim 1, wherein a first middle line of the first groove is vertically aligned to a second middle line of a space between the first device die and the second device die.

5. The package of claim 1, wherein the package component further comprises:
   a third device die separated from the second device die by a space, wherein the thermal interface material comprises a second groove vertically aligned to the space.

6. The package of claim 1, wherein the first groove has a top width and a bottom width smaller than the top width.

7. The package of claim 1, wherein the first groove has an inversed trapezoidal shape.

8. The package of claim 1, wherein the thermal interface material comprises:
   a second portion over and contacting the first device die; and
   a third portion over and contacting the second device die, wherein the first portion physically joins the second portion and the third portion to form a continuous thermal interface material.

9. The package of claim 8, wherein the thermal interface material is free from grooves whose majority portions are in the second portion and the third portion.

10. The package of claim 1, wherein the filling material comprises a gel or silicone.

11. A package comprising:
   a first package component;
   a second package component over and bonding to the first package component;
   a third package component over and bonding to the first package component;
   an encapsulant encapsulating the second package component and the third package component therein;
   a first thermal interface material over and contacting the second package component;
   a second thermal interface material over and contacting the third package component, wherein the first thermal interface material and the second thermal interface material are portions of a continuous thermal interface material, and the continuous thermal interface material comprises a groove between the first thermal interface material and the second thermal interface material, and wherein in a cross-sectional view of the package, the continuous thermal interface material is free from grooves that have majority portions in regions directly over the second package component and the third package component; and
   a heat sink over and in contact with both of the first thermal interface material and the second thermal interface material.

12. The package of claim 11, wherein the groove is an air groove.

13. The package of claim 11 further comprising a filling material filling the groove, wherein the filling material is electrically non-conductive.

14. The package of claim 13 further comprising:

an underfill between the second package component and the third package component, wherein the underfill and the filling material contact opposing surfaces of a portion of the continuous thermal interface material.

15. The package of claim 11, wherein the continuous thermal interface material comprises a portion directly under the groove.

16. A package comprising:

a first device die;

a second device die, wherein the first device die is spaced apart from the second device die by an intermediate region;

a thermal interface material comprising:

a first portion over and contacting the first device die;

a second portion over and contacting the second device die, wherein the first portion and the second portion have a first thickness; and a third portion connecting the first portion to the second portion, wherein the third portion has a second thickness smaller than the first thickness, wherein the third portion overlaps the intermediate region;

a groove overlapping the third portion of the thermal interface material; and a filling material in the groove, wherein the filling material is separated from the intermediate region by the third portion of the thermal interface material.

17. The package of claim 16, wherein the first portion, the second portion, and the third portion are formed of a same material.

18. The package of claim 16, wherein the thermal interface material is free from distinguishable interfaces between the first portion, the second portion, and the third portion.

19. The package of claim 16, wherein the thermal interface material is free from grooves whose majority portions are in the first portion and the second portion.

20. The package of claim 16, wherein the filling material comprises a gel or silicone.

* * * * *